(12) United States Patent
Ninomiya

(10) Patent No.: US 10,826,430 B2
(45) Date of Patent: Nov. 3, 2020

(54) SEMICONDUCTOR DEVICE, MOVEMENT AND ELECTRONIC WATCH

(71) Applicant: Seiko Epson Corporation, Tokyo (JP)

(72) Inventor: Masaya Ninomiya, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/554,670

(22) Filed: Aug. 29, 2019

(65) Prior Publication Data

US 2020/0076365 A1 Mar. 5, 2020

(30) Foreign Application Priority Data

Aug. 30, 2018 (JP) ................................ 2018-161123

(51) Int. Cl.
*H03K 3/282* (2006.01)
*H03B 5/12* (2006.01)
*G04G 3/02* (2006.01)

(52) U.S. Cl.
CPC ............ *H03B 5/1228* (2013.01); *G04G 3/02* (2013.01)

(58) Field of Classification Search
CPC ................................ H03B 5/1228; G04G 3/02
USPC .................... 331/117 R, 116 FE, 116 M, 158
See application file for complete search history.

(56) References Cited

U.S. PATENT DOCUMENTS

| 4,405,906 A * | 9/1983 | Luscher | H03K 3/3545 |
|---|---|---|---|
| | | | 331/116 FE |
| 2004/0075508 A1 | 4/2004 | Miyahara et al. | |
| 2007/0189125 A1 | 8/2007 | Ogasawara et al. | |
| 2011/0291767 A1* | 12/2011 | Ishikawa | H03B 5/36 |
| | | | 331/154 |

FOREIGN PATENT DOCUMENTS

| JP | S58-015305 A | 1/1983 |
|---|---|---|
| JP | H06-140838 A | 5/1994 |
| JP | H08-293732 A | 11/1996 |
| JP | 2001-257534 A | 9/2001 |
| JP | 2004-096711 A | 3/2004 |
| JP | 2004-128593 A | 4/2004 |
| JP | 2007-218733 A | 8/2007 |

* cited by examiner

*Primary Examiner* — Richard Tan
(74) *Attorney, Agent, or Firm* — Harness, Dickey & Pierce, P.L.C.

(57) ABSTRACT

An oscillating circuit includes an input terminal and an output terminal, to both of which an oscillator is coupled, a DC cut capacitor having one terminal of two terminals that is coupled to the input terminal, an inverter having an input side coupled to the other terminal of the DC cut capacitor and an output side coupled to the output terminal, a first feedback resistor coupled in parallel to the inverter, a second feedback resistor coupled in parallel to the DC cut capacitor and the inverter, and a switch coupled in parallel to the DC cut capacitor.

9 Claims, 21 Drawing Sheets

SEMICONDUCTOR DEVICE, MOVEMENT AND ELECTRONIC WATCH

The present application is based on, and claims priority from JP Application Serial Number 2018-161123, filed Aug. 30, 2018, the disclosure of which is hereby incorporated by reference herein in its entirety.

BACKGROUND

1. Technical Field

The present disclosure relates to a semiconductor device, a movement, and an electronic watch.

2. Related Art

An oscillating circuit illustrated in FIG. 3 of JP-A-2004-96711 is known as an oscillating circuit that can stably oscillate an oscillator such as a crystal oscillator, and has little fluctuation in oscillation frequency. The oscillating circuit is configured to include an oscillating inverter coupled to the oscillator via a signal path, and a first feedback resistor coupled to an input/output side of the oscillating inverter. In addition, a direct current (DC) cut capacitor is disposed for anti-oscillation suppression by a leak generated at the input terminal of the oscillator. When the DC cut capacitor is disposed on the input terminal side of the signal path, the potential on the input terminal side is close to an open state and not fixed, thus, a parasitic capacitance fluctuates with the occurrence of leakage current due to the influence of humidity or the like, and the oscillation frequency fluctuates. In order to prevent this fluctuation of the oscillation frequency, a second feedback resistor is coupled between the input terminal of the signal path and the output terminal of the inverter.

However, in the oscillating circuit of JP-A-2004-96711, in addition to the oscillation caused by the crystal oscillator, a closed loop self-oscillation is generated by the oscillating inverter and the first feedback resistor, thus there is a problem that proper oscillation cannot be achieved.

SUMMARY

An oscillator circuit according to the present disclosure includes an input terminal and an output terminal, alto both of which an oscillator is coupled, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor coupled in parallel to the DC cut capacitor and the inverter, and a switch coupled in parallel to the DC cut capacitor.

An oscillating circuit according to the present disclosure includes an input terminal and an output terminal, to both of which an oscillator is coupled, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor coupled in parallel to the DC cut capacitor and the inverter, a first switch coupled in parallel to the DC cut capacitor, a second switch coupled between an input side of the first feedback resistor and an input side of the inverter, a third switch coupled between an output side of the inverter and a point between the second switch and the first feedback resistor, and a fourth switch coupled between the output side of the inverter and output sides of the first feedback resistor and the second feedback resistor.

An oscillating circuit according to the present disclosure includes an input terminal and an output terminal, to both of which an oscillator is coupled, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor coupled in parallel to the DC cut capacitor and the inverter, a first switch coupled in parallel to the DC cut capacitor, a second switch coupled between an input side of the second feedback resistor and an input side of the DC cut capacitor, a third switch coupled between an output side of the inverter and a point between the second switch and the second feedback resistor, and a fourth switch coupled between the output side of the inverter and output sides of the first feedback resistor and the second feedback resistor.

An oscillator circuit according to the present disclosure includes an input terminal and an output terminal, to both of which an oscillator is coupled, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor configured as a variable resistor that is coupled in parallel to the DC cut capacitor and the inverter, a first switch coupled in parallel to the DC cut capacitor, a second switch coupled in series to the first feedback resistor, a third switch configured to change the variable resistance value of the second feedback resistor by switching between a short-circuit state and an open state.

An oscillator circuit according to the present disclosure includes an input terminal and an output terminal, to both of which an oscillator is coupled, a DC cut capacitor, one of two terminals of which is coupled to the input terminal, an inverter, the input side of which is coupled to the other terminal of the DC cut capacitor and the output side of which is coupled to the output terminal, a first feedback resistor configured as a variable resistor that is coupled in parallel to the inverter, a second feedback resistor coupled in parallel to the DC cut capacitor and the inverter, a first switch coupled in parallel to the DC cut capacitor, a second switch coupled in series to the second feedback resistor, a third switch configured to change the variable resistance value of the first feedback resistor by switching between a short-circuit state and an open state.

The present disclosure is a semiconductor device including an oscillator circuit and a control circuit, the oscillator circuit includes an input terminal and an output terminal coupled to an oscillator, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor coupled in parallel to the DC cut capacitor and the inverter, and a switch coupled in parallel to the DC cut capacitor, wherein the control circuit is configured to short-circuit the switch at a start of oscillation of the oscillator and open the switch after a predetermined time elapsed from the start of the oscillation.

The present disclosure is a semiconductor device including an oscillator circuit and a control circuit, the oscillator circuit includes an input terminal and an output terminal coupled to an oscillator, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor coupled in parallel to the DC cut capacitor and the inverter, a first switch coupled in parallel to the DC cut capacitor, a second switch coupled between an input side of the first feedback resistor and an input side of the inverter, a third switch coupled between an output side of the inverter and a point between the second switch and the first feedback resistor, a fourth switch coupled between the output side of the inverter and output sides of the first feedback resistor and the second feedback resistor, wherein the control circuit is configured to short-circuit the first switch and the third switch and open the second switch and the fourth switch at the start of oscillation of the oscillator, and open the first switch and the third switch and short-circuit the second switch and the fourth switch after a predetermined time elapsed from the start of the oscillation.

The present disclosure is a semiconductor device including an oscillator circuit and a control circuit, the oscillator circuit includes an input terminal and an output terminal coupled to an oscillator, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor coupled in parallel to the DC cut capacitor and the inverter, a first switch coupled in parallel to the DC cut capacitor, a second switch coupled between an input side of the second feedback resistor and an input side of the DC cut capacitor, a third switch coupled between an output side of the inverter and a point between the second switch and the second feedback resistor, a fourth switch coupled between the output side of the inverter and output sides of the first feedback resistor and the second feedback resistor, wherein the control circuit is configured to short-circuit the first switch and the third switch and open the second switch and the fourth switch at a start of oscillation of the oscillator, and open the first switch and the third switch and short-circuit the second switch and the fourth switch after a predetermined time elapsed from the start of the oscillation.

The present disclosure is a semiconductor device including an oscillator circuit and a control circuit, the oscillator circuit includes an input terminal and an output terminal coupled to an oscillator, a DC cut capacitor, one of two terminals of which is coupled to the input terminal, an inverter, the input side of which is coupled to the other terminal of the DC cut capacitor and the output side of which is coupled to the output terminal, a first feedback resistor coupled in parallel to the inverter, a second feedback resistor configured as a variable resistor that is coupled in parallel to the DC cut capacitor and the inverter, a first switch coupled in parallel to the DC cut capacitor, a second switch coupled in series to the first feedback resistor, a third switch configured to change the variable resistance value of the second feedback resistor by switching between a short-circuit state and an open state, wherein the control circuit is configured to short-circuit the first switch, open the second switch, and set the third switch to one state of the short-circuit state or the open state at the start of oscillation of the oscillator, and open the first switch, short-circuit the second switch, and set the third switch to the other state of the short-circuit state or the open state after a predetermined time elapsed from the start of the oscillation.

The present disclosure is a semiconductor device including an oscillator circuit and a control circuit, the oscillator circuit includes an input terminal and an output terminal coupled to an oscillator, a DC cut capacitor, one of two terminals of which is coupled to the input terminal, an inverter, the input side of which is coupled to the other terminal of the DC cut capacitor and the output side of which is coupled to the output terminal, a first feedback resistor configured as a variable resistor that is coupled in parallel to the inverter, a second feedback resistor coupled in parallel to the DC cut capacitor and the inverter, a first switch coupled in parallel to the DC cut capacitor, a second switch coupled in series to the second feedback resistor, a third switch configured to change the variable resistance value of the first feedback resistor by switching between a short-circuit state and an open state, wherein the control circuit is configured to short-circuit the first switch, open the second switch, and set the third switch to one state of the short-circuit state or the open state at the start of oscillation of the oscillator, and open the first switch, short-circuit the second switch, and set the third switch to the other state of the short-circuit state or the open state after a predetermined time elapsed from the start of the oscillation.

A movement according to the present disclosure includes the semiconductor device described above.

An electronic watch according to the present disclosure includes the semiconductor device described above.

DESCRIPTION OF EXEMPLARY EMBODIMENTS

Below, exemplary embodiments according to the present disclosure will be described with reference to the drawings.

First Embodiment

Figure 1:
FIG. 1 is a front view illustrating an electronic watch according to an embodiment of the present disclosure.

As illustrated in FIG. 1, an electronic watch 1 is a watch mounted on a wrist of a user, and includes an outer case 2, an dial 3 having a disk shape, a seconds hand 5, a minute hand 6, an hour hand 7, which are hands driven by a movement (not illustrated), and a crown 8 which is an operation member. Note that, a date display and the seconds hand 5 are not required, and the electronic watch 1 may not include the seconds hand 5 or the date display member such as a date indicator, a day indicator and the like.

Figure 2:
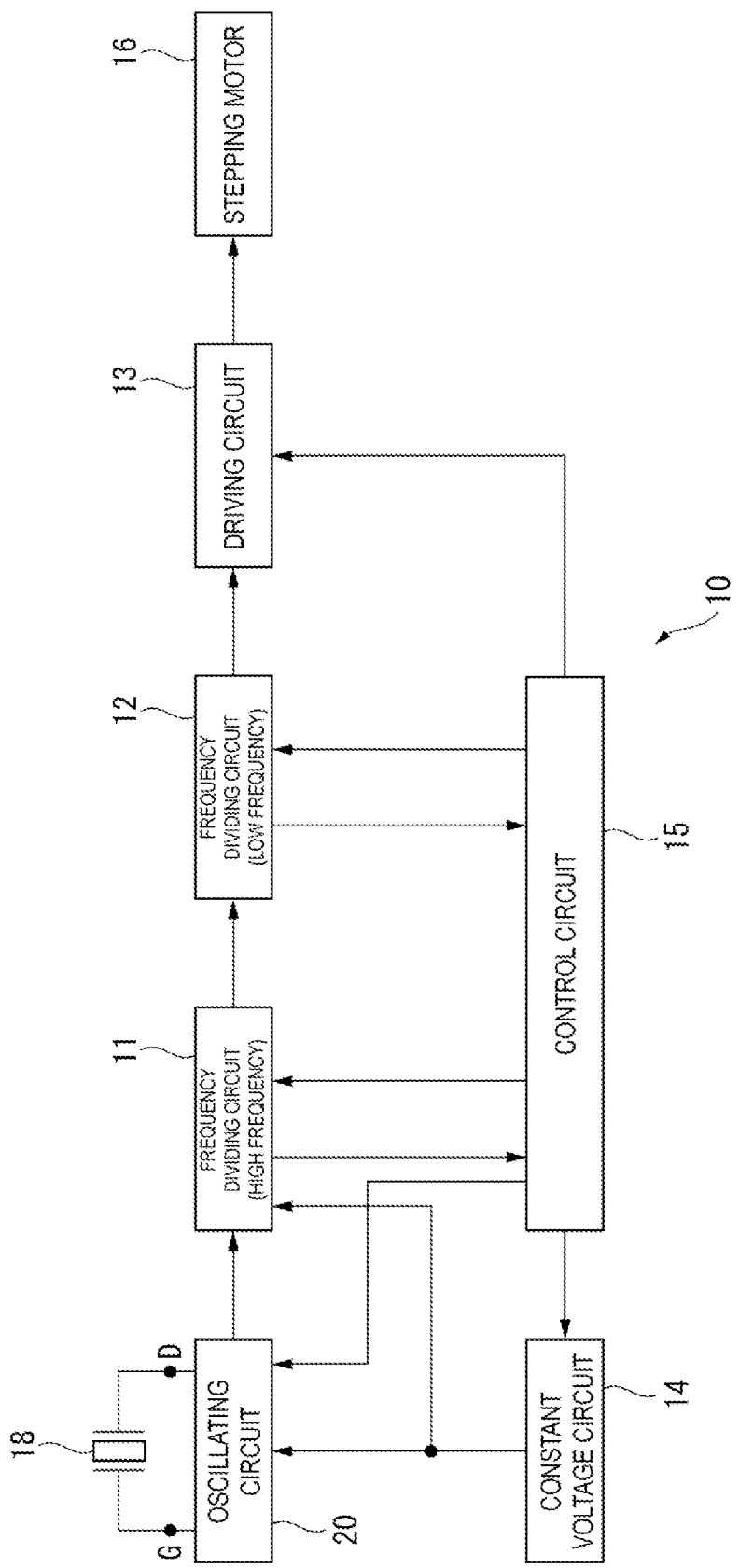
FIG. 2 is a block diagram illustrating a configuration of a movement according to an embodiment of the present disclosure.

The movement of the electronic watch 1 includes a semiconductor device 10 constituted by CMOS-IC or the like. As illustrated in FIG. 2, the semiconductor device 10 includes an oscillating circuit 20, a frequency dividing circuit 11 for high frequency, a frequency dividing circuit 12 for low frequency, a driving circuit 13, a constant voltage circuit 14, and a control circuit 15. The driving circuit 13 is a circuit configured to drive a stepping motor 16, and the stepping motor 16 moves the seconds hand 5, the minute hand 6, and the hour hand 7 via a driving wheel train (not illustrated). Note that, CMOS is an abbreviation of Complementary Metal Oxide Semiconductor.

The oscillating circuit 20 is a circuit configured to oscillate a crystal oscillator 18, which is an oscillation source, and is integrally formed on a semiconductor substrate, and the crystal oscillator 18 is coupled to an input terminal G and an output terminal D of the signal path.

Figure 3:
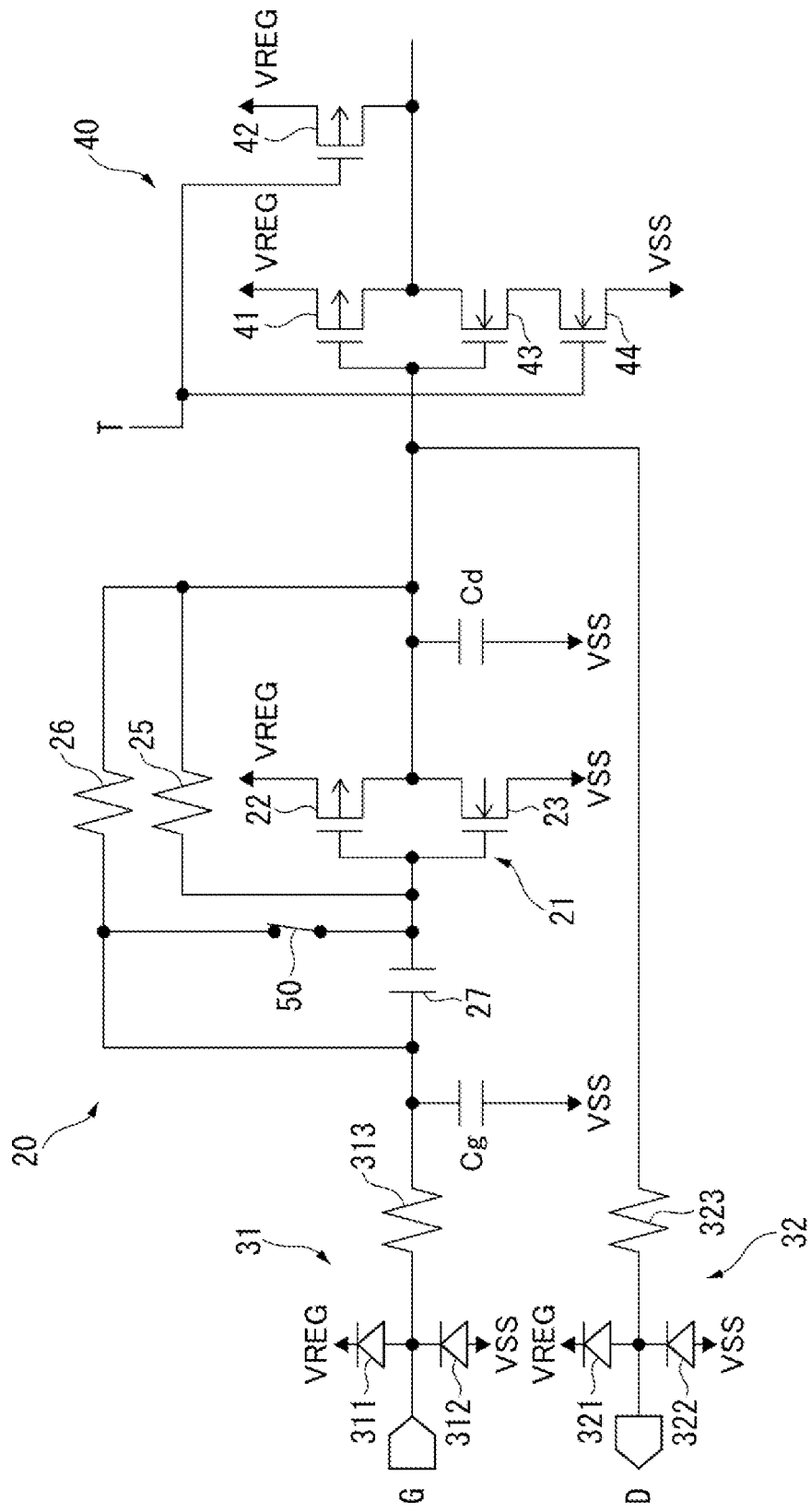
FIG. 3 is a circuit diagram illustrating an oscillating circuit at the start of the oscillation according to First Embodiment.
Figure 4:
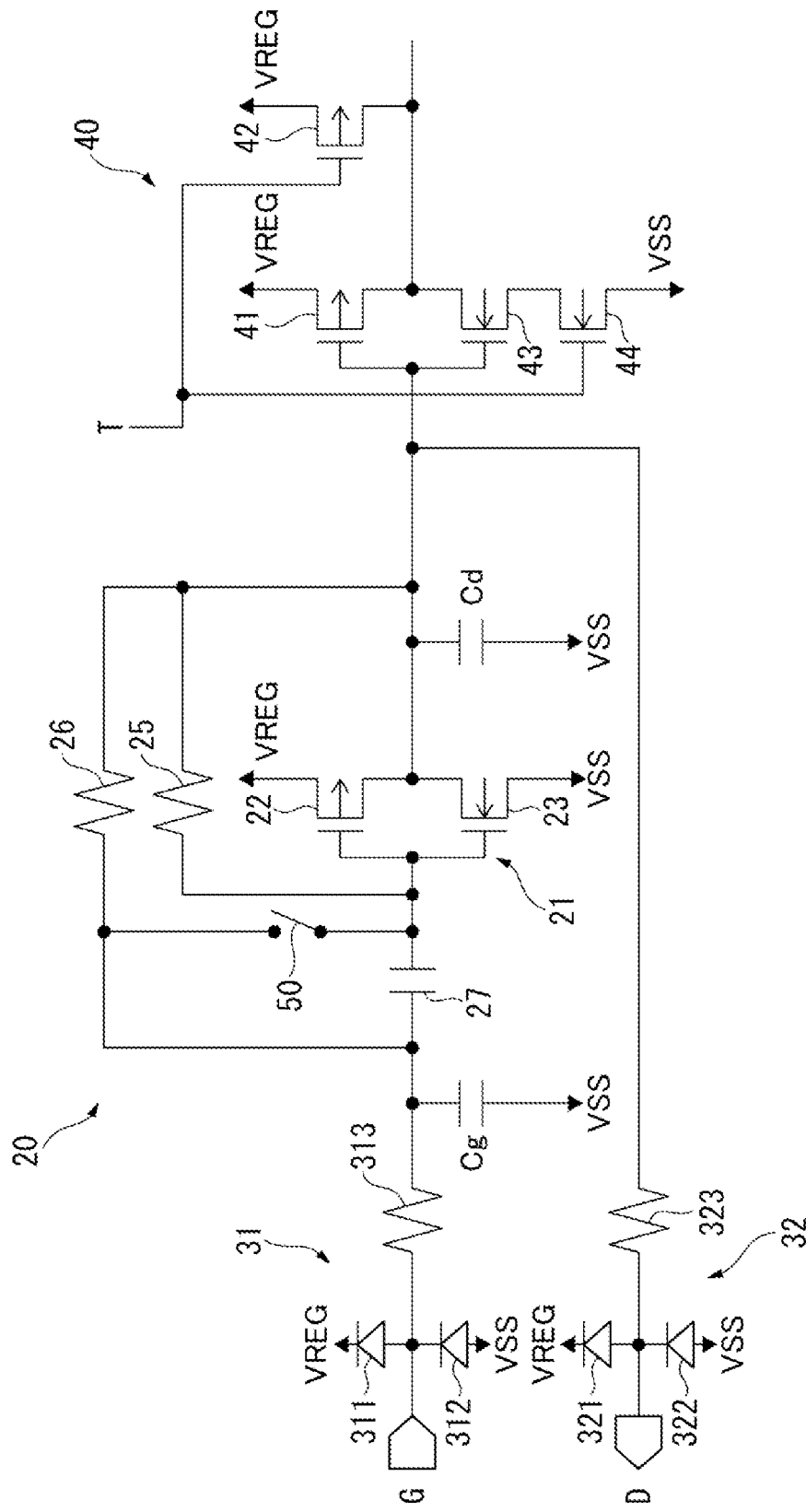
FIG. 4 is a circuit diagram illustrating the oscillating circuit at the time of stable oscillation according to First Embodiment.

As illustrated in FIGS. 3 and 4, the oscillating circuit 20 includes an inverter 21, a first feedback resistor 25, a second feedback resistor 26, a DC cut capacitor 27, a first electrostatic protection circuit 31, a second electrostatic protection circuit 32, and a switch 50. Note that the DC cut capacitor 27 will be described as a DC cut capacitor 27 in the following description.

The inverter 21 is an oscillating inverter configured by a P-channel MOSFET22 and an N-channel MOSFET23. MOSFET is an abbreviation of Metal-Oxide-Semiconductor Field Effect Transistor.

The first feedback resistor 25 is a resistor coupled in parallel to the inverter 21, causing the inverter 21 to function as an amplifier.

The second feedback resistor 26 is coupled in parallel to the inverter 21 and the DC cut capacitor 27. As illustrated in FIG. 3, when the switch 50 is short-circuited, that is, when the switch 50 is turned on, the second feedback resistor 26 forms a signal path bypassing the DC cut capacitor 27 and is coupled in parallel to the first feedback resistor 25. Thus, the feedback resistance of the inverter 21 is configured by the first feedback resistor 25 and the second feedback resistor 26 which are coupled in parallel, and when the combined resistance value is set to be R and the resistance value of the first feedback resistor 25 is set to be R1, the resistance value of the second feedback resistor 26 is set to be R2, R=(R1×R2)/(R1+R2). When R1=R2, R=R1/2.

As illustrated in FIG. 4, when the switch 50 is open, that is, when the switch 50 is turned off, by disposing the DC cut capacitor 27, the second feedback resistor 26 functions as a circuit that stabilizes the potential of the input terminal G which is close to an open state and is not fixed in potential.

Therefore, the resistance value R1 of the first feedback resistor 25 and the resistance value R2 of the second feedback resistor 26 may be set in consideration of the combined resistance value R at the start of the oscillation, the potential level of the input terminal G at the time of stable oscillation and the feedback resistance value at the time of stable oscillation.

The DC cut capacitor 27 is disposed between an input side of the inverter 21 and the input terminal G, and directly separates the signal path.

The first electrostatic protection circuit 31 and the second electrostatic protection circuit 32 prevent ingress of a surge voltage from outside. In other words, the crystal oscillator 18 is externally attached to the oscillating circuit 20 via the input terminal G and the output terminal D, and slight leaks may occur in the input terminal G and the output terminal D due to the influence of light and humidity, and the like, and a surge voltage may intrude and affect the internal circuit. Thus, the first electrostatic protection circuit 31 is disposed on the signal line on the input terminal G side of the oscillating circuit 20, and the second electrostatic protection circuit 32 is disposed on the signal line on the output terminal D side, to prevent the surge voltage from intruding.

Each electrostatic protection circuit 31, 32 includes a first semiconductor rectifier 311, 321, a second semiconductor rectifier 312, 322, and a protection resistor 313, 323. The first semiconductor rectifiers 311 and 321 are coupled between the signal path and a predetermined constant voltage VREG, and bypass a static voltage of a first polarity intruding the signal path to the constant voltage VREG side. The second semiconductor rectifiers 312 and 322 are coupled between the signal path and a reference potential VSS, and bypass a static voltage of a second polarity intruding the signal path to the reference potential VSS side.

As a result, a negative polarity or a positive polarity surge voltage that has invaded from the outside is bypassed via the electrostatic protection circuits 31 and 32, and is prevented from intruding to the oscillating circuit 20. Note that, the protection element is not limited to the circuit configuration of the electrostatic protection circuits 31 and 32, and a protection element having a circuit configuration different from that of the electrostatic protection circuits 31 and 32 may be used.

Cg and Cd in FIGS. 3 and 4 respectively represent an oscillation capacitor on the input terminal G side and an oscillation capacitor on the output terminal D side of the crystal oscillator 18. Note that, in FIGS. 3 and 4, the oscillation capacitors Cg and Cd are coupled to the reference potential VSS, but may be coupled to the constant voltage VREG side. Further, the electrostatic protection circuits 31 and 32 are coupled between the constant voltage VREG and the reference potential VSS, but may be coupled between a power supply voltage VDD and the reference potential VSS.

In FIGS. 3 and 4, the reference potential is referred to as a low potential side power supply voltage VSS, but a high potential side power supply voltage VDD may be a reference potential and the low potential side power supply voltage VSS may be a constant voltage. Therefore, VREG in FIGS. 3 and 4 is VDD, and VSS is a constant voltage. In this case as well, the oscillation capacitors Cg and Cd may be coupled to the constant voltage VSS or may be coupled to the reference potential VDD.

A NAND circuit 40 for waveform shaping is disposed on the output side of the oscillating circuit 20. The NAND circuit 40 is a general NAND circuit including P-channel MOSFETs 41 and 42 and N-channel MOSFETs 43 and 44. A signal of a specific frequency, for example 32 kHz, is input from the oscillating circuit 20 to the gates of the MOSFETs 41 and 43, and a predetermined control signal T, for example a H level signal T, is input to the gates of the MOSFETs 42 and 44. Thus, a shaped clock signal is output from the NAND circuit 40.

The switch 50 is a switch that is coupled in parallel to the DC cut capacitor 27 and capable of bypassing the DC cut capacitor 27. In the present embodiment, the switch 50 is disposed on a signal line coupling the input side of the second feedback resistor 26 and the output side of the DC cut capacitor 27, that is, the inverter 21 side.

Figure 5:
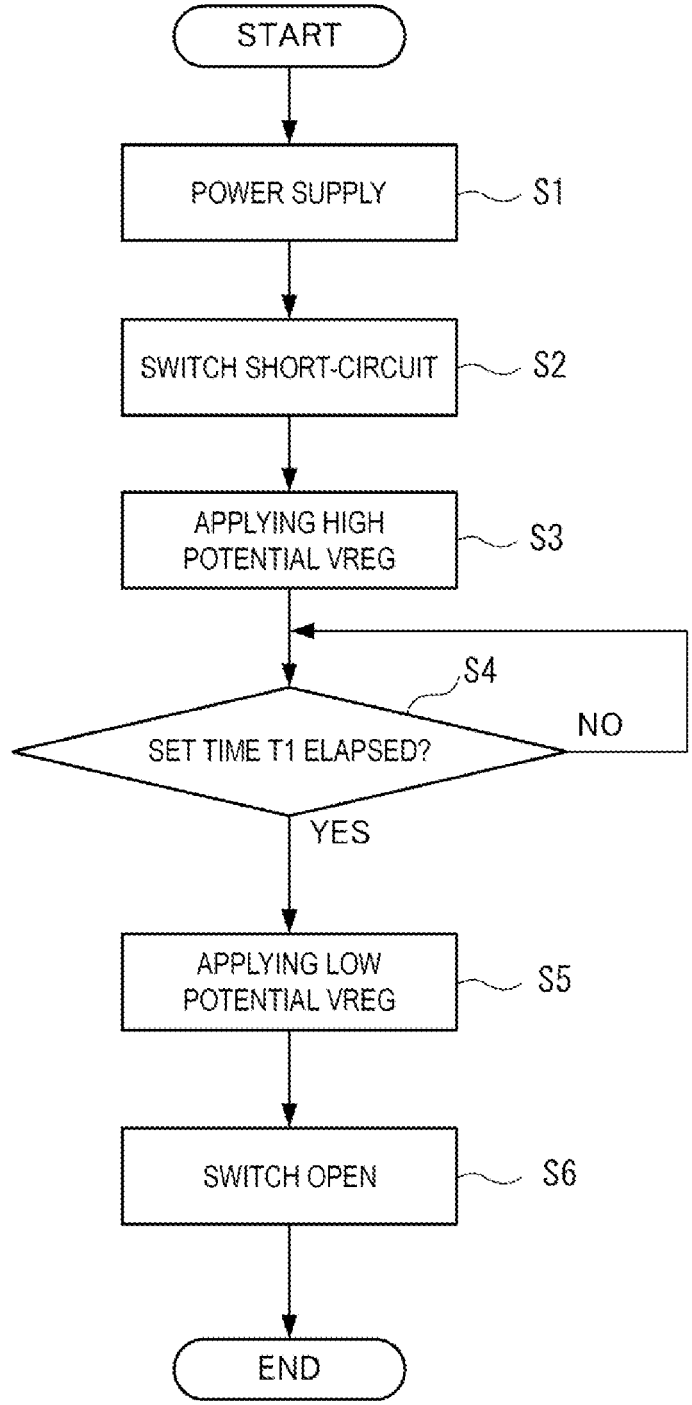
FIG. 5 is a flowchart illustrating a control process of the oscillating circuit according to First Embodiment.

Next, a control process of the oscillating circuit 20 performed by the control circuit 15 will be described with reference to the flowchart of FIG. 5.

When power supply is implemented by battery exchange or the like performed in step S1, the control circuit 15 short-circuits the switch 50 in step S2. By performing step S2, the oscillating circuit 20 is in a state illustrated in FIG. 3.

Next, the control circuit 15 executes step S3 and controls the constant voltage circuit 14 to apply a high potential VREG to the oscillating circuit 20. The high potential VREG is 1.58 V, for example.

Next, the control circuit 15 executes step S4 to determine whether a preset set time t1 has elapsed. The set time t1 is 0.5 seconds, for example, and when the high potential VREG is applied, the set time t1 is a time sufficient to stabilize the oscillation of the crystal oscillator 18. The set time t1 until oscillation of the crystal 18 is stable may be set by performing an experiment or the like. Further, the determination of whether the set time t1 has elapsed can be implemented by determining a number of clock signals output from the NAND circuit 40 since power supply is implemented until the set time t1 has elapsed by experiment in advance, and counting the number of signals output from the NAND circuit 40 and measuring the set time t1.

When the control circuit 15 determines NO in step S4, that is, when the set time t1 has not elapsed, the control circuit 15 continues the determination process of step S4. On the other hand, when the control circuit 15 determines YES in step S4, the control circuit 15 executes step S5 and controls the constant-voltage circuit 14 to switch to the application of a low potential VREG. The low potential VREG is 0.91 V, for example.

Next, the control circuit 15 executes step S6 and opens the switch 50.

Accordingly, the control process at the start of the oscillation ends, and the crystal oscillator 18 continues a stable oscillation. At this time, the constant voltage circuit 14 is maintained at the low potential VREG, and the switch 50 is maintained in the open state.

Note that, the processes of step S2 and step S3 may be executed at the same timing. Similarly, the processes of step S5 and step S6 may also be executed at the same timing.

Effects of First Embodiment

According to First Embodiment as described above, at the start of the oscillation of the oscillating circuit 20, the switch 50 is short-circuited to bypass the DC cut capacitor 27, thus, a self-oscillation by a closed loop can be eliminated. Therefore, the influence of the self-oscillation can be eliminated, and activation characteristics of the oscillating circuit 20 can be improved.

Further, the feedback resistance value can be changed between when the switch 50 is short-circuited and when the switch 50 is opened. That is, when the switch 50 is short-circuited, the resistance value is smaller than that when the switch 50 is opened. For this reason, due to the capability of the inverter 21 or the like, when the oscillation circuit 20 in which the activation characteristics can be improved by setting the feedback resistance value at the start of the oscillation smaller than the feedback resistance value after the oscillation becomes stable, the switch 50 can be short-circuited at the start of the oscillation to couple the first feedback resistor 25 and the second feedback resistor 26 in parallel to reduce the feedback resistance value, thus the activation characteristics can be further improved.

The control circuit 15 controls the constant voltage circuit 14 and applies the high potential VREG to the oscillating circuit 20 at the start of the oscillation, thus the activation characteristics of the oscillating circuit 20 can be further improved. Furthermore, after the set time t1 has elapsed, the control circuit 15 controls the constant voltage circuit 14 to switch to the low potential VREG, thus, after the oscillation is stable, the applied voltage level can be maintained low, and power consumption can be reduced accordingly. Therefore, when a primary battery is used as a power source of the electronic watch 1, battery life can be extended.

The control circuit 15 performs a voltage switching process of VREG after the set time t1 has elapsed, thus, the process can be performed with a simple control, and the semiconductor device 10 can be prevented from increasing in size. That is, when a detection circuit configured to detect an oscillation state is incorporated and the oscillation state is detected to perform the voltage switching process, the semiconductor device 10 increases in size and costs are also increased, due to the incorporation of the detection circuit. In contrast, as in the present embodiment, when the voltage switching process is performed by the set time t1, the detection circuit in the oscillating state is unnecessary, and the semiconductor device 10 can be prevented from increasing in size.

Second Embodiment

Next, Second Embodiment of the present disclosure will be described with reference to FIGS. 6 to 8. Note that, in Second Embodiment, the same or similar components as or to those of First Embodiment will be given the same reference numerals and detailed description will be omitted or simplified.

Figure 6:
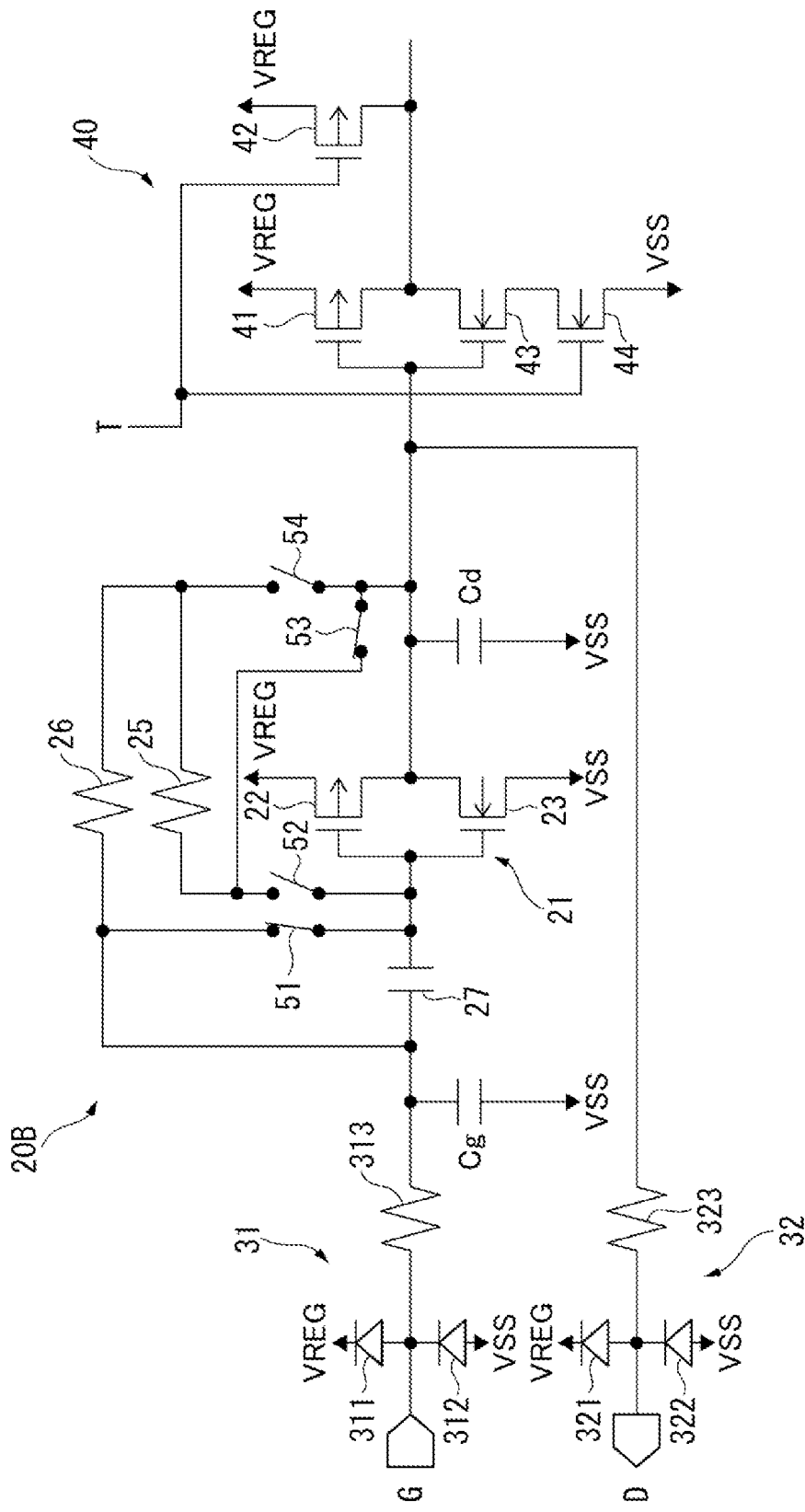
FIG. 6 is a circuit diagram illustrating an oscillating circuit at the start of the oscillation according to Second Embodiment.
Figure 7:
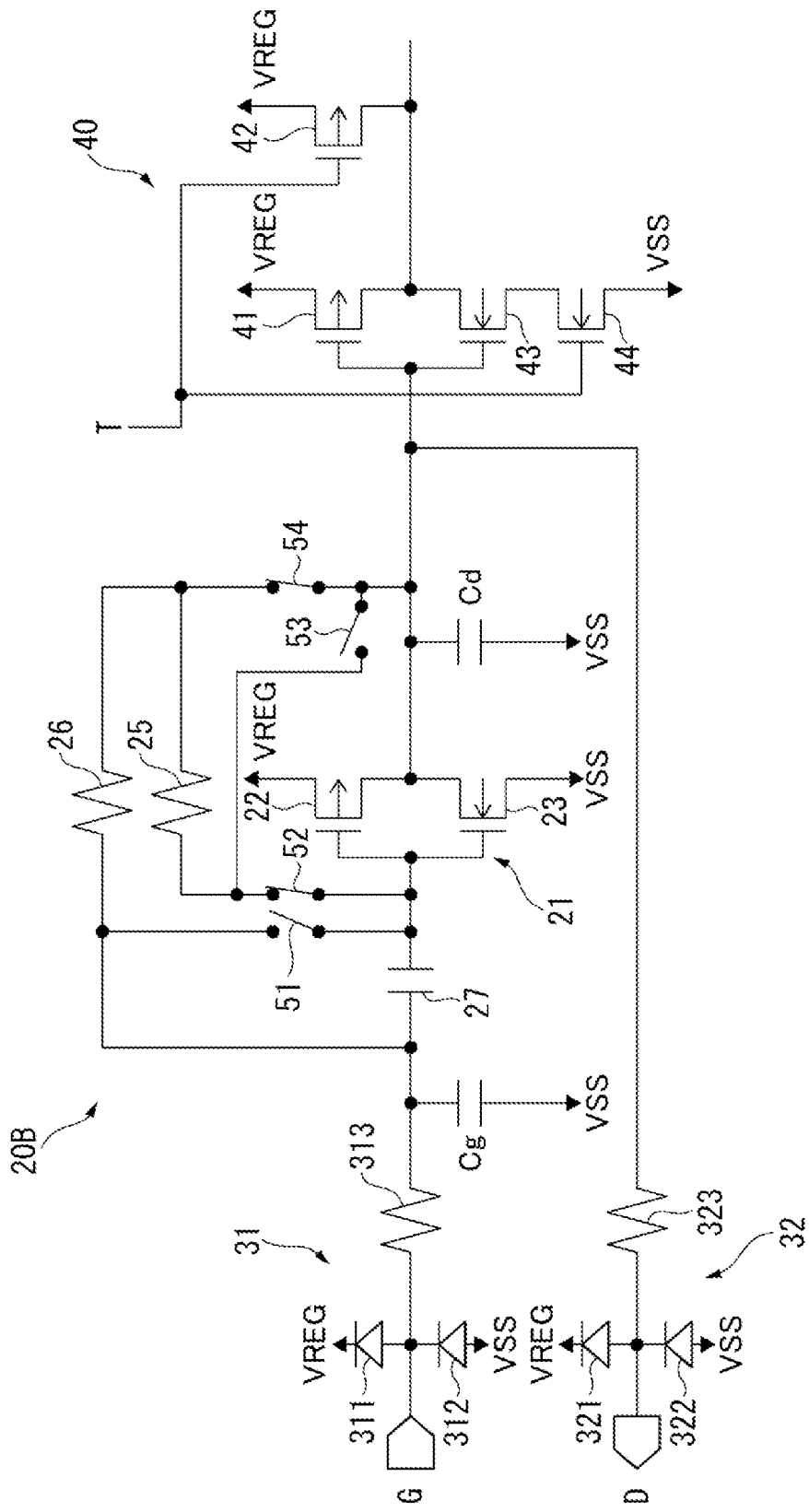
FIG. 7 is a circuit diagram illustrating the oscillating circuit at the time of stable oscillation according to Second Embodiment.

As illustrated in FIGS. 6 and 7, the oscillating circuit 20B of Second Embodiment is different from the oscillating circuit 20 of First Embodiment in that a first switch 51, a second switch 52, a third switch 53, and a fourth switch 54 are provided. The rest of the configuration of the oscillating circuit 20B is the same as those of the oscillating circuit 20, and thus the description of them is omitted.

Similar to the switch 50 of First Embodiment, the first switch 51 is coupled in parallel to the DC cut capacitor 27. Specifically, the first switch 51 is disposed on a signal line coupling the input side of the second feedback resistor 26 and the output side of the DC cut capacitor 27, that is, the inverter 21 side.

The second switch 52 is disposed on a signal line coupling the input side of the first feedback resistor 25 and the input side of the inverter 21, that is, a point between the DC cut capacitor 27 and the inverter 21.

The third switch 53 is disposed on a signal line coupling between the output side of the inverter 21 and a point between the first feedback resistor 25 and the second switch 52.

The fourth switch 54 is disposed on a signal line coupling the output side of the first feedback resistor 25 and the second feedback resistor 26 and the output side of the inverter 21.

Next, a control process of the oscillating circuit 20B performed by the control circuit 15 will be described with reference to the flowchart of FIG. 8. Note that, in the flowchart of FIG. 8, S11 and S13 to S15 other than S12, S16 are the same process as that of S1, S3 to S5 of the flowchart of FIG. 5, and thus the description of them is omitted.

When power supply is implemented by battery exchange or the like performed in step S11, the control circuit 15 executes step S12, short-circuits the first switch 51 and the third switch 53, opens the second switch 52 and the fourth switch 54, and controls the state as illustrated in FIG. 6. In this case, the first feedback resistor 25 and the second feedback resistor 26 are coupled in series. Thus, when respective resistance values of the feedback resistor 25 and the feedback resistor 26 are R1 and R2, the resistance value of the feedback resistance coupled in parallel to the inverter 21 is R1+R2, and is twice of R1 when R1=R2.

Next, in step S13, the control circuit 15 controls the constant voltage circuit 14 to apply a high potential VREG to the oscillating circuit 20B.

Next, in step S14, the control circuit 15 determines whether a preset set time t1 has elapsed, and when it is determined NO in step S14, the control circuit 15 continues the determination process of step S14. On the other hand, when it is determined YES in step S14, the control circuit 15 executes step S15 and controls the constant voltage circuit 14 to switch to apply a low potential VREG.

Next, the control circuit 15 executes step S16, opens the first switch 51 and the third switch 53, short-circuits the second switch 52 and the fourth switch 54, and controls the state illustrated in FIG. 7. In this case, the circuit is the same as the state in which the switch 50 is opened in First Embodiment. Thus, the return resistance is smaller than in the state of FIG. 6.

Accordingly, the control process at the start of the oscillation ends, and the crystal oscillator 18 continues a stable oscillation. At this time, the constant voltage circuit 14 is maintained at the low potential VREG, and the oscillating circuit 20B is maintained in the state of FIG. 7, that is, the first switch 51 and the third switch 53 are maintained in an open state and the second switch 52 and the fourth switch 54 are maintained in a short-circuit state.

Note that, the processes of step S12 and step S13 may be executed at the same timing. Similarly, the processes of step S15 and step S16 may also be executed at the same timing.

Effects of Second Embodiment

According to Second Embodiment as described above, as in First Embodiment, at the start of the oscillation of the oscillating circuit 20, the first switch 51 is short-circuited to bypass the DC cut capacitor 27, thus, a self-oscillation by a closed loop can be eliminated, and activation characteristics of the oscillating circuit 20 can be improved.

In addition, as illustrated in FIG. 6, at the start of the oscillation, the first feedback resistor 25 and the second feedback resistor 26 can be coupled in series, thus, the feedback resistance value can be increased. Therefore, it is possible to provide an oscillating circuit 20B suitable for the case where the activation characteristics can be improved when the feedback resistance value at the start of the oscillation is greater than the feedback resistance value after the oscillation is stable.

Similar to First Embodiment, the control circuit 15 controls the constant voltage circuit 14 to switch the potential of VREG between the start of the oscillation and the time of stable oscillation, thus, the activation characteristics of the oscillating circuit 20 can be improved and the power consumption can be reduced. Further, similar to First Embodiment, the control circuit 15 performs a voltage switching process of VREG after the set time t1, thus, the process can be performed with a simple control, and the semiconductor device 10 can be prevented from increasing in size.

Third Embodiment

Next, Third Embodiment of the present disclosure will be described with reference to FIGS. 9 to 11. Note that, in Third Embodiment, the same or similar components as or to those of Second Embodiment will be given the same reference numerals and detailed description will be omitted or simplified.

Figure 9:
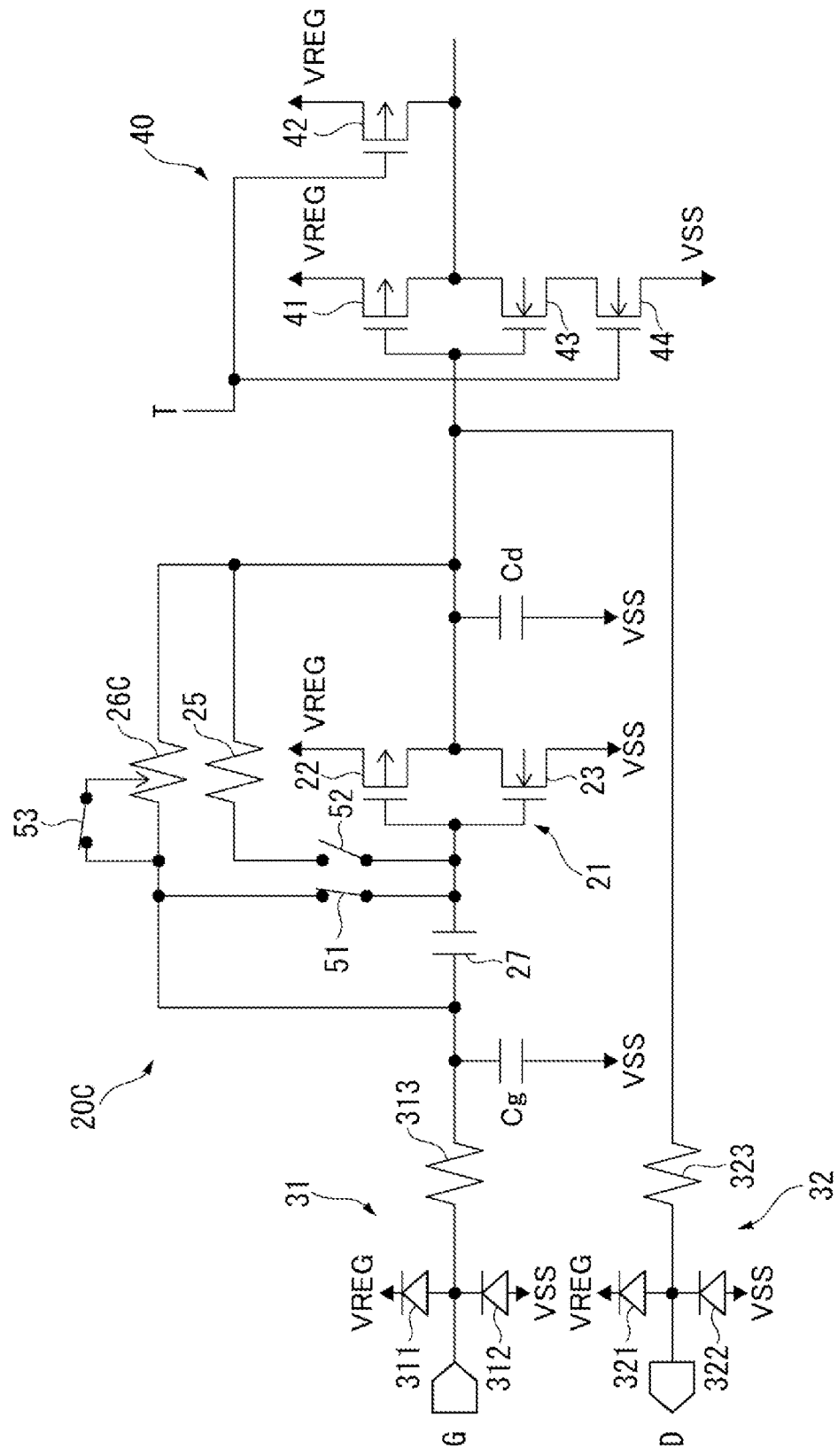
FIG. 9 is a circuit diagram illustrating the oscillating circuit at the start of the oscillation according to Third Embodiment.
Figure 10:
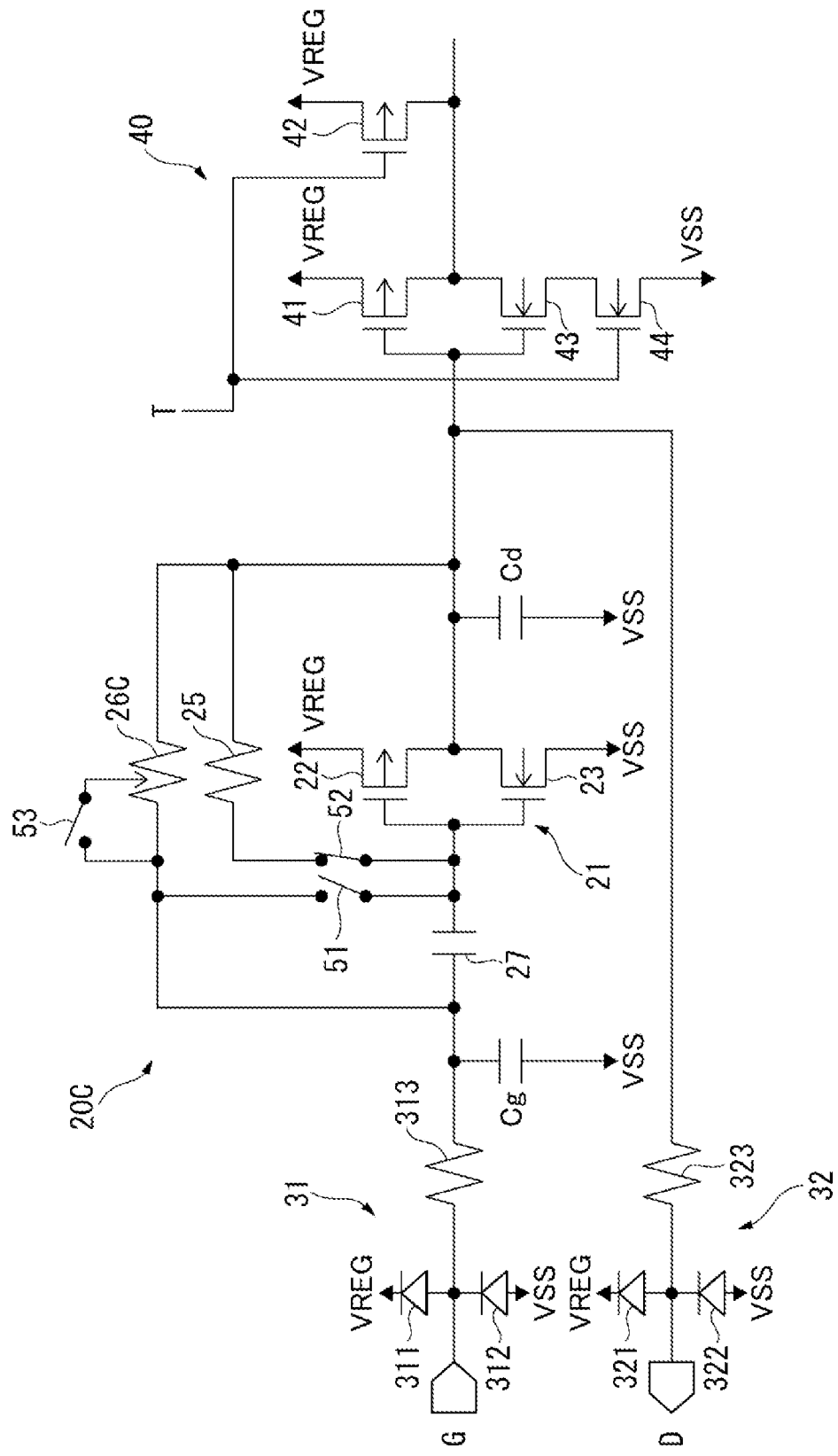
FIG. 10 is a circuit diagram illustrating the oscillating circuit at the time of stable oscillation according to Third Embodiment.
Figure 11:
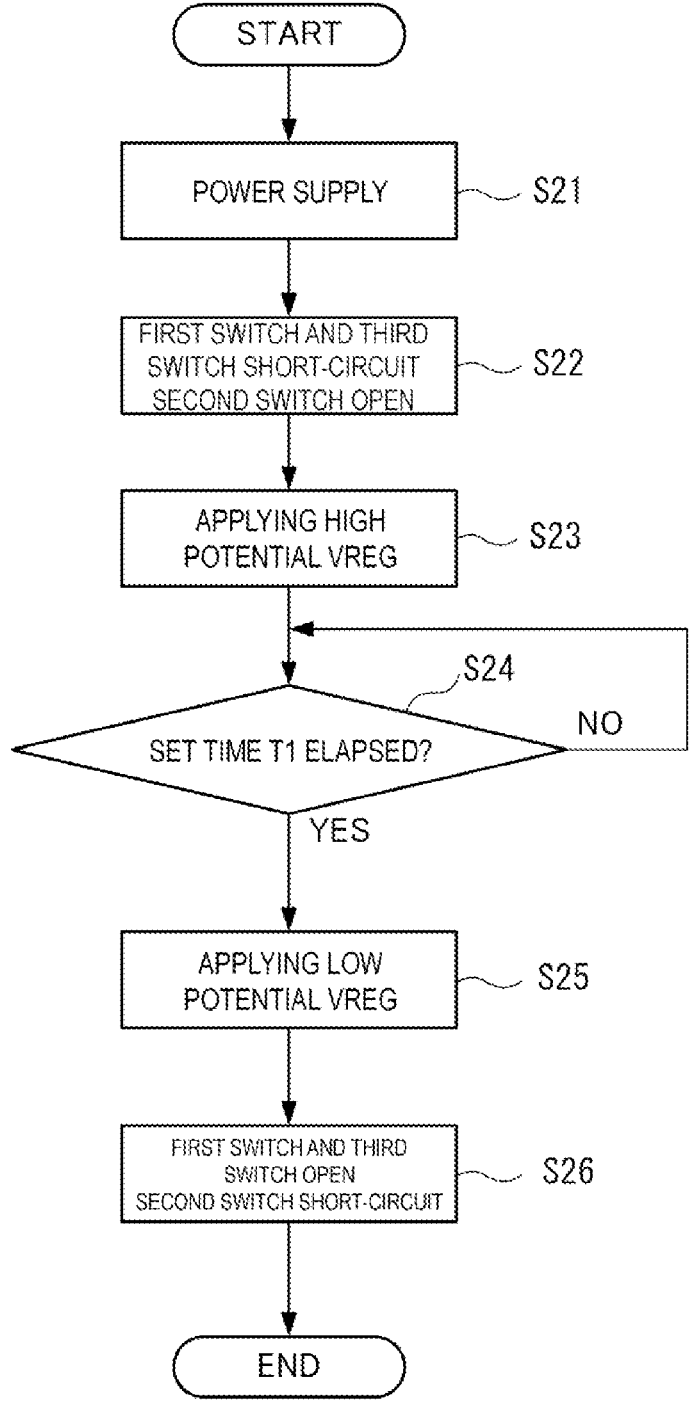
FIG. 11 is a flowchart illustrating a control process of the oscillating circuit of Third Embodiment.

As illustrated in FIGS. 9 and 10, an oscillating circuit 20C according to Third Embodiment is different from the oscillating circuit 20B according to Second Embodiment in that a variable resistor is used as a second feedback resistor 26C, that the third switch 53 is used to switch the resistance value of the second feedback resistor 26C, and that the oscillating circuit 20C does not include the fourth switch 54. The rest of the configuration of the oscillating circuit 20C is the same as those of the oscillating circuit 20B, and thus the description of them is omitted.

The first switch 51 and the second switch 52 are the same as those of Second Embodiment, thus the description of them is omitted.

The third switch 53 is a switch that switches the resistance value of the second feedback resistor 26C, which is a variable resistor. The resistance value of the second feedback resistor 26C when the third switch 53 is opened is set to be R3, and the resistance value of the second feedback resistor 26C when the third switch 53 is short-circuited is set to be R4, the third switch 53 is set to exhibit a relationship R3>R4.

Next, a control process of the oscillating circuit 20C performed by the control circuit 15 will be described with reference to the flowchart of FIG. 11. Note that, in the flowchart of FIG. 11, S21 and S23 to S25 other than S22, S26 are the same process as that of S1, S3 to S5 of the flowchart of FIG. 5.

When power supply is implemented in step S21, the control circuit 15 executes step S22, short-circuits the first switch 51 and the third switch 53, opens the second switch 52, and controls the state as illustrated in FIG. 9. Thus, in the oscillating circuit 20C at the start of the oscillation, the DC cut capacitor 27 is bypassed due to the first switch 51 being short-circuited. Further, by opening the second switch 52, the first feedback resistor 25 is uncoupled, and only the second feedback resistor 26C functions as a feedback resistance. Further, by short-circuiting the third switch 53, the resistance value of the second feedback resistor 26C is set to be R4, which is set to be a lower resistance value than R3.

Next, in step S23, the control circuit 15 controls the constant voltage circuit 14 to apply a high potential VREG to the oscillating circuit 20C.

Next, in step S24, the control circuit 15 determines whether a preset set time t1 has elapsed, and when it is determined NO in step S24, the control circuit 15 continues the determination process of step S24. On the other hand, when it is determined YES in step S14, the control circuit 15 executes step S15 and controls the constant voltage circuit 14 to switch to apply a low potential VREG.

Next, the control circuit 15 executes step S26, opens the first switch 51 and the third switch 53, short-circuits the second switch 52, and controls the state illustrated in FIG. 10. In this case, the circuit is the same as the state in which the switch 50 is opened in First Embodiment. Thus, when the resistance value of the first feedback resistor 25 is R1 and R1=R3, the feedback resistance value is greater than in the state of FIG. 9.

Accordingly, the control process at the start of the oscillation ends, and the crystal oscillator 18 continues a stable oscillation. At this time, the constant voltage circuit 14 is maintained at the low potential VREG, and the oscillating circuit 20C is maintained in the state of FIG. 10, that is, the first switch 51 and the third switch 53 are maintained in an open state and the second switch 52 is maintained in a short-circuit state.

Note that, the processes of step S22 and step S23 may be executed at the same timing. Similarly, the processes of step S25 and step S26 may also be executed at the same timing.

Effects of Third Embodiment

According to Third Embodiment described above, in addition to the same effects as Second Embodiment, and the effects described below can also be obtained.

As illustrated in FIG. 9, at the start of the oscillation, the first feedback resistor 25 is uncoupled and the third switch 53 is short-circuited to switch the second feedback resistor 26C to a small resistance value R4. Therefore, it is possible to provide an oscillating circuit 20C suitable for the case where the activation characteristic can be improved when the feedback resistance value at the start of the oscillation is smaller than the feedback resistance value at the time of stable oscillation.

Fourth Embodiment

Next, Fourth Embodiment of the present disclosure will be described with reference to FIGS. 12 and 13. Note that, in Fourth Embodiment, the same or similar components as or to those of Third Embodiment will be given the same reference numerals and detailed description will be omitted or simplified.

Figure 12:
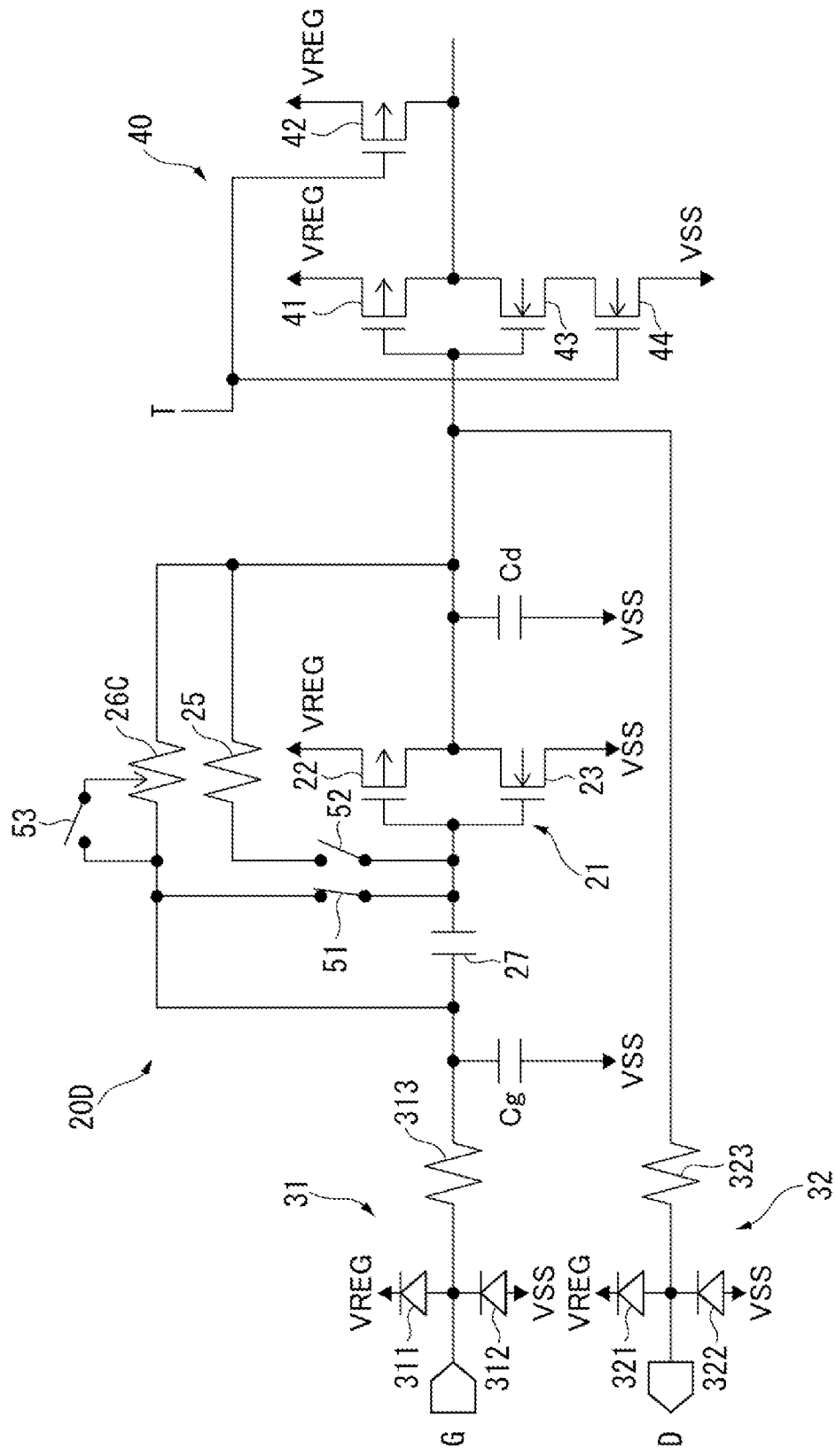
FIG. 12 is a circuit diagram illustrating an oscillating circuit at the start of the oscillation according to Fourth Embodiment.
Figure 13:
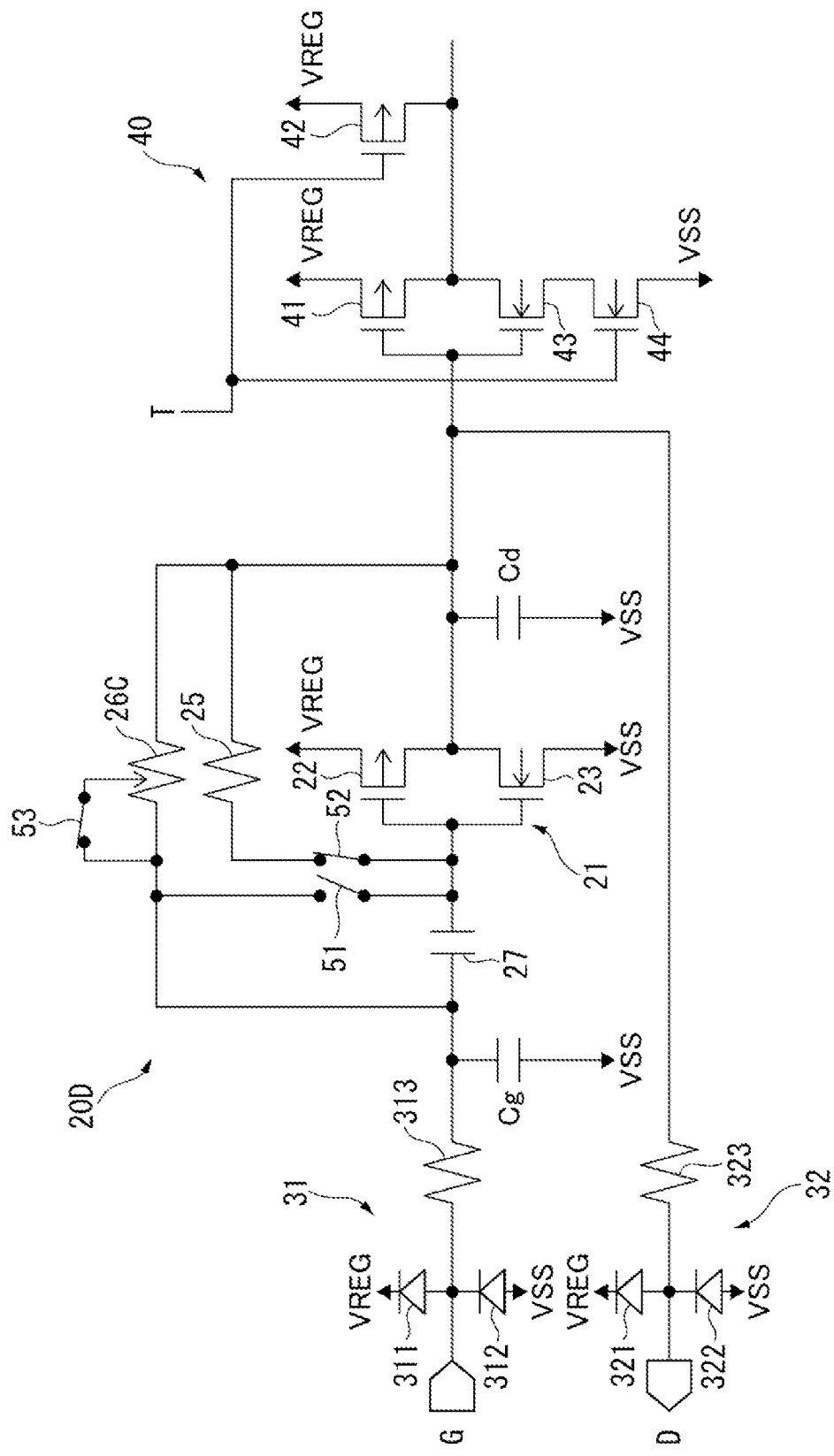
FIG. 13 is a circuit diagram illustrating the oscillating circuit at the time of stable oscillation according to Fourth Embodiment.

As illustrated in FIGS. 12 and 13, the oscillating circuit 20D according to Fourth Embodiment is different from the oscillating circuit 20C according to Third Embodiment in that the third switch 53 is opened at the start of the oscillation, and that the third switch 53 is short-circuited during oscillation stabilization after the set time t1 has elapsed, and the other configuration is the same as Third Embodiment, thus descriptions of them will be omitted.

Note that, although the flowchart of Fourth Embodiment is not illustrated, only step S22 and step S26 in the flowchart of FIG. 11 according to Third Embodiment are modified as follows.

That is, in step S22, the first switch 51 is short-circuited, the second switch 52 and the third switch 53 are opened, and in step S26, the first switch 51 is opened, the second switch 52 and the third switch 53 are short-circuited.

Note that, as in Third Embodiment, the processes of step S22 and step S23 may be executed at the same timing. Similarly, the processes of step S25 and step S26 may also be executed at the same timing.

As illustrated in FIG. 12, when the oscillation of the oscillating circuit 20D starts, the control circuit 15 short-circuits the first switch 51, and opens the second switch 52 and the third switch 53. Thus, in the oscillating circuit 20D at the start of the oscillation, the DC cut capacitor 27 is bypassed due to the first switch 51 being short-circuited. Further, by opening the second switch 52, the first feedback resistor 25 is uncoupled, and only the second feedback resistor 26C functions as a feedback resistance. Further, by opening the third switch 53, the resistance value of the second feedback resistor 26C is set to R3, which is set to a higher resistance value than R4.

As illustrated in FIG. 13, after the set time t1 has elapsed from the start of the oscillation, the control circuit 15 opens the first switch 51, and short-circuits the second switch 52 and the third switch 53. In this case, the resistance value of the second feedback resistor 26C is set to R4, which is set to a lower resistance value than R3.

Effects of Fourth Embodiment

According to Fourth Embodiment described above, in addition to the same effects as Third Embodiment, and the effects described below can also be obtained.

As illustrated in FIG. 12, at the start of the oscillation, the second switch 52 is opened, the first feedback resistor 25 is uncoupled, and the third switch 53 is opened to set the second return resistance 26C to a resistance value R3, which is higher than R4. Therefore, it is possible to provide an oscillating circuit 20D suitable for the case where the activation characteristic can be improved when the feedback resistance value at the start of the oscillation is greater than the feedback resistance value at the time of stable oscillation. In addition, the resistance value of the second feedback resistor 26C at the time of stable oscillation can be set by a variable resistance.

Fifth Embodiment

Next, Fifth Embodiment of the present disclosure will be described with reference to FIGS. 14 and 15. Note that, in Fifth Embodiment, the same or similar components as or to those of Second Embodiment will be given the same reference numerals and detailed description will be omitted or simplified.

Figure 14:
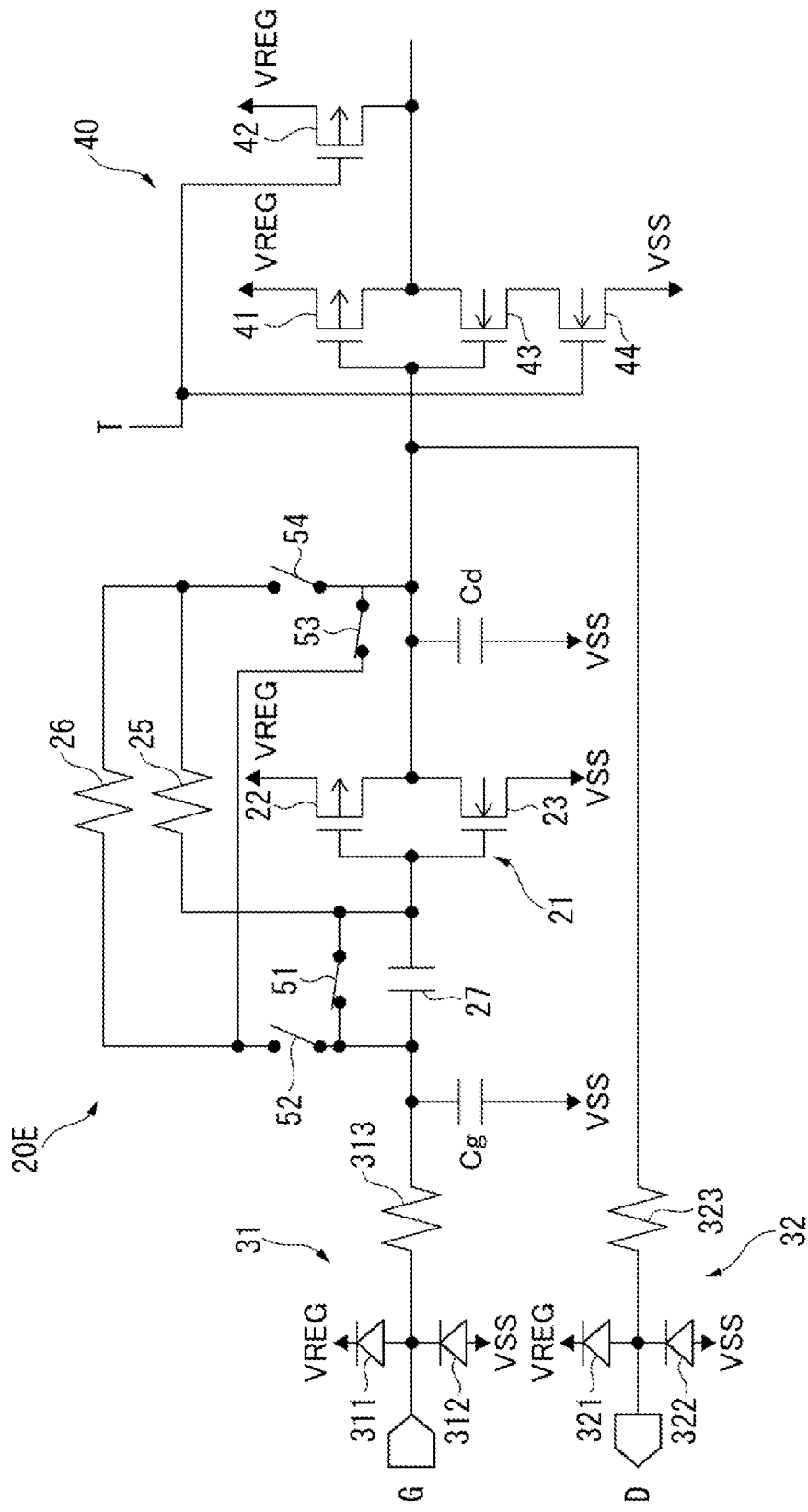
FIG. 14 is a circuit diagram illustrating an oscillating circuit at the start of the oscillation according to Fifth Embodiment.
Figure 15:
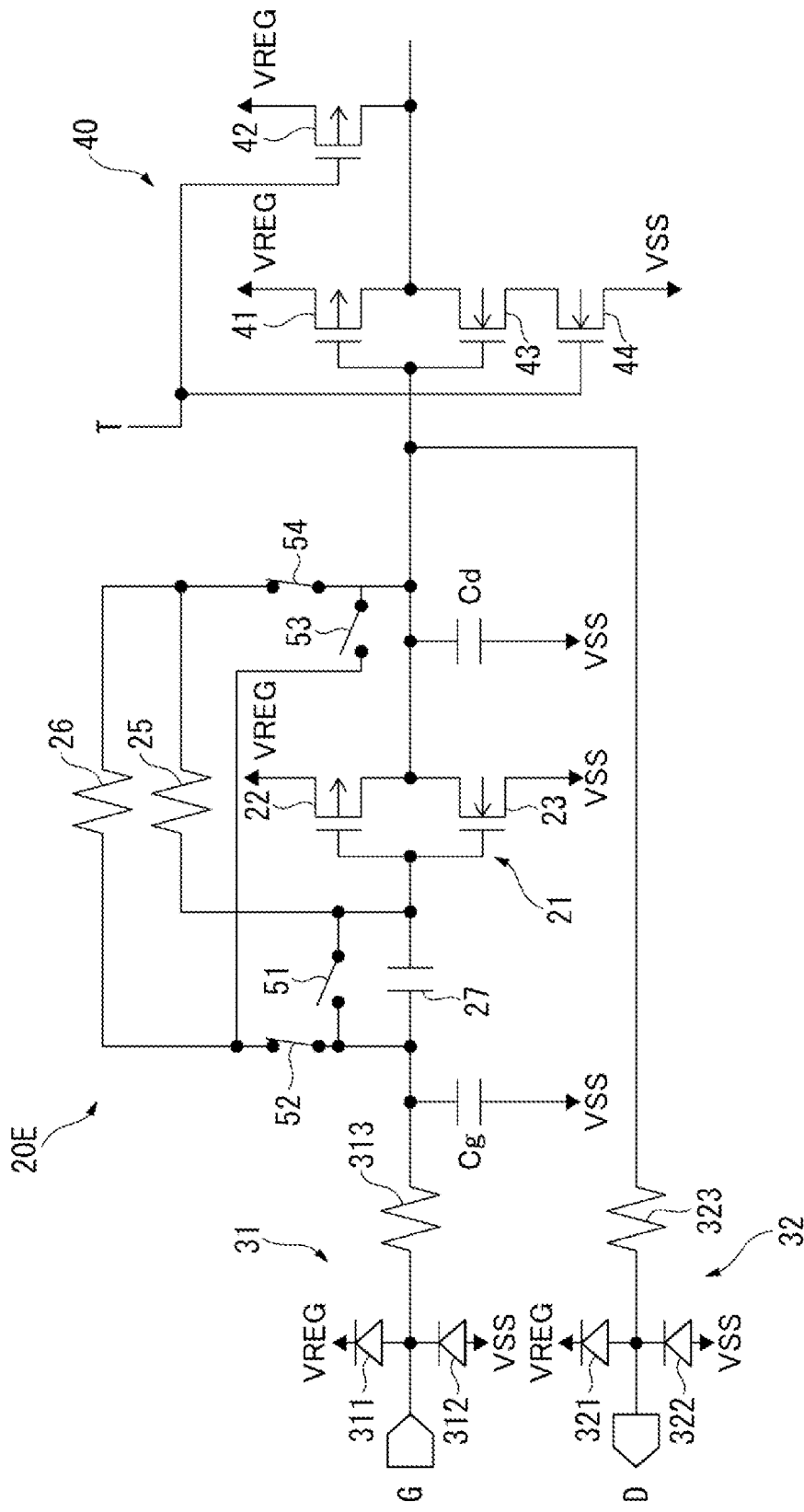
FIG. 15 is a circuit diagram illustrating the oscillating circuit at the time of stable oscillation according to Fifth Embodiment.

As illustrated in FIGS. 14 and 15, an oscillating circuit 20E according to Fifth Embodiment is different from the oscillating circuit 20B according to Second Embodiment in the arrangement of each of the switches 51 to 54, the rest of the configuration and control process are the same as those of Second Embodiment, and thus descriptions of them will be omitted.

In the oscillating circuit 20E, the first switch 51 is the same as the oscillating circuit 20B in that the first switch 51 is disposed in parallel with the DC cut capacitor 27 and can bypass the DC cut capacitor 27. Further, the fourth switch 54 is the same as that of the oscillating circuit 20B in that the fourth switch 54 is disposed between the output side of the first feedback resistor 25 and the second feedback resistor 26 and the output side of the inverter 21.

On the other hand, in the oscillating circuit 20E, the second switch 52 is disposed between the input side of the second feedback resistor 26 and the input side of the DC cut capacitor 27. A third switch 53 is disposed between the second feedback resistor 26 and the second switch 52 and the output side of the inverter 21.

Figure 8:
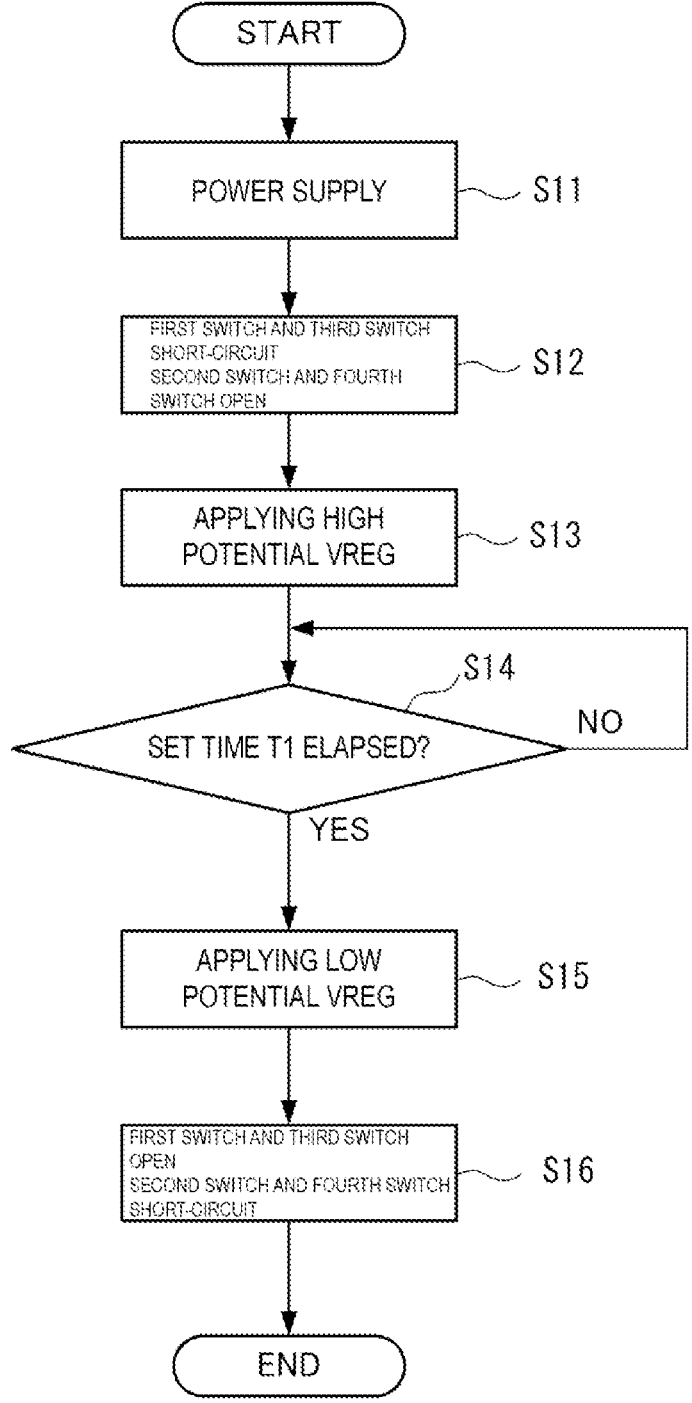
FIG. 8 is a flowchart illustrating a control process of the oscillating circuit according to Second Embodiment.

In Fifth Embodiment, the control circuit 15 performs the same control as the flowchart illustrated in FIG. 8 according to Second Embodiment. That is, as illustrated in FIG. 14, at the start of the oscillation of the oscillating circuit 20E, the first switch 51 and the third switch 53 are short-circuited, and the second switch 52 and the fourth switch 54 are opened. Thus, in the oscillating circuit 20E at the start of the oscillation, the DC cut capacitor 27 is bypassed due to the first switch 51 being short-circuited. In addition, the third switch 53 is short-circuited, and the second switch 52 and the fourth switch 54 are opened, thus, the first feedback resistor 25 and the second feedback resistor 26 are coupled in series between the input side and the output side of the inverter 21, and the return resistance value becomes as high as R1+R2.

As illustrated in FIG. 15, after the set time t1 has elapsed from the start of the oscillation, that is, at the time of stable oscillation, the control circuit 15 opens the first switch 51 and the third switch 53, and short-circuits the second switch 52 and the fourth switch 54. In this case, the circuit is the same as the state in which the switch 50 is opened in First Embodiment. Thus, the return resistance is smaller than in the state of FIG. 14.

Note that, similar to Second Embodiment, the processes of step S12 and step S13 may be executed at the same timing. Similarly, the processes of step S15 and step S16 may also be executed at the same timing.

Effects of Fifth Embodiment

According to Fifth Embodiment, the same effects as those of the Second Embodiment can be obtained.

Other Exemplary Embodiments

Note that the present disclosure is not limited to each of the embodiments described above, and variations, modifications, and the like within the scope in which the object of the present disclosure can be achieved are included in the present disclosure.

First Modified Example

Figure 16:
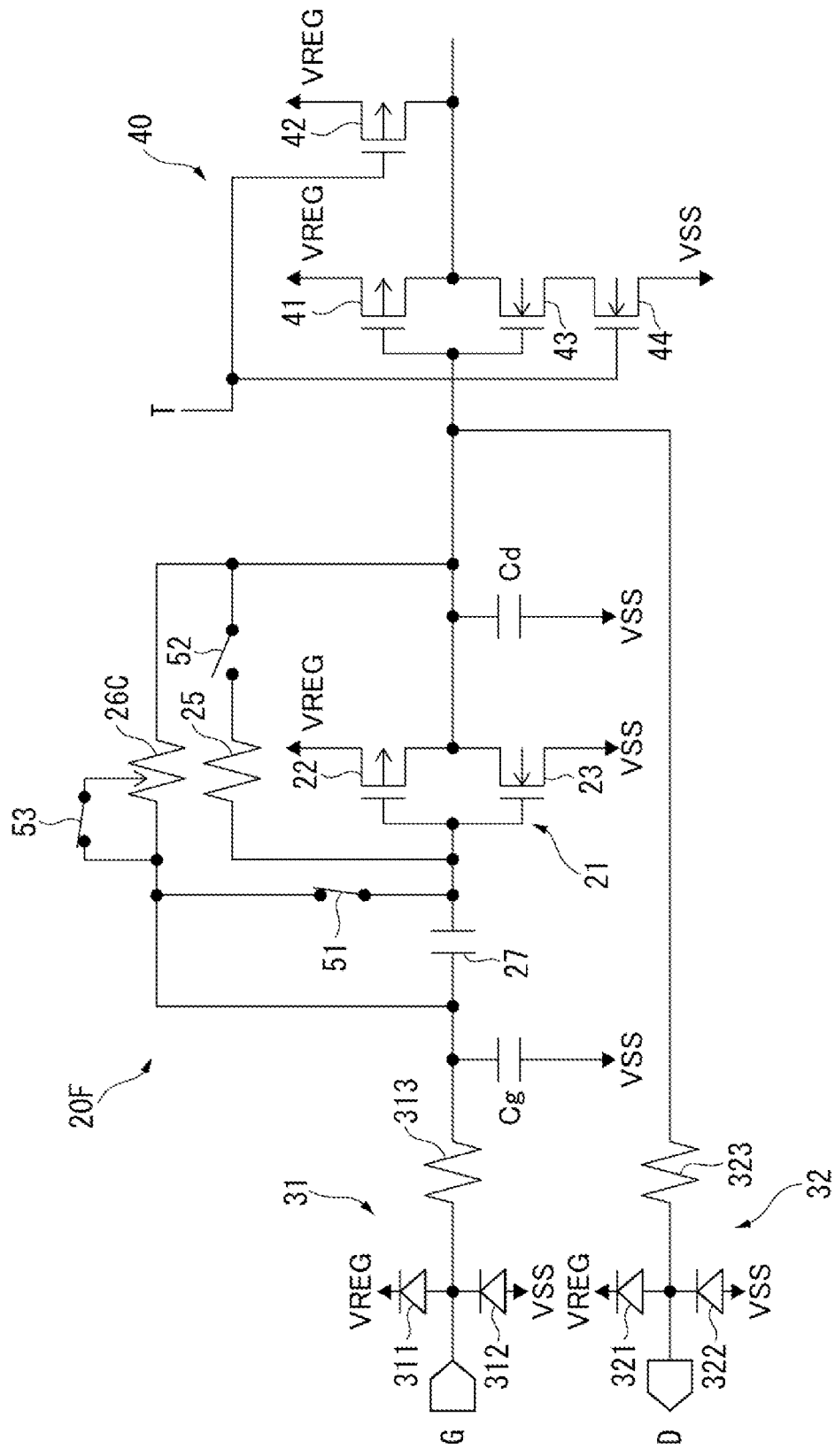
FIG. 16 is a circuit diagram illustrating an oscillating circuit at the start of the oscillation according to a first modified example.
Figure 17:
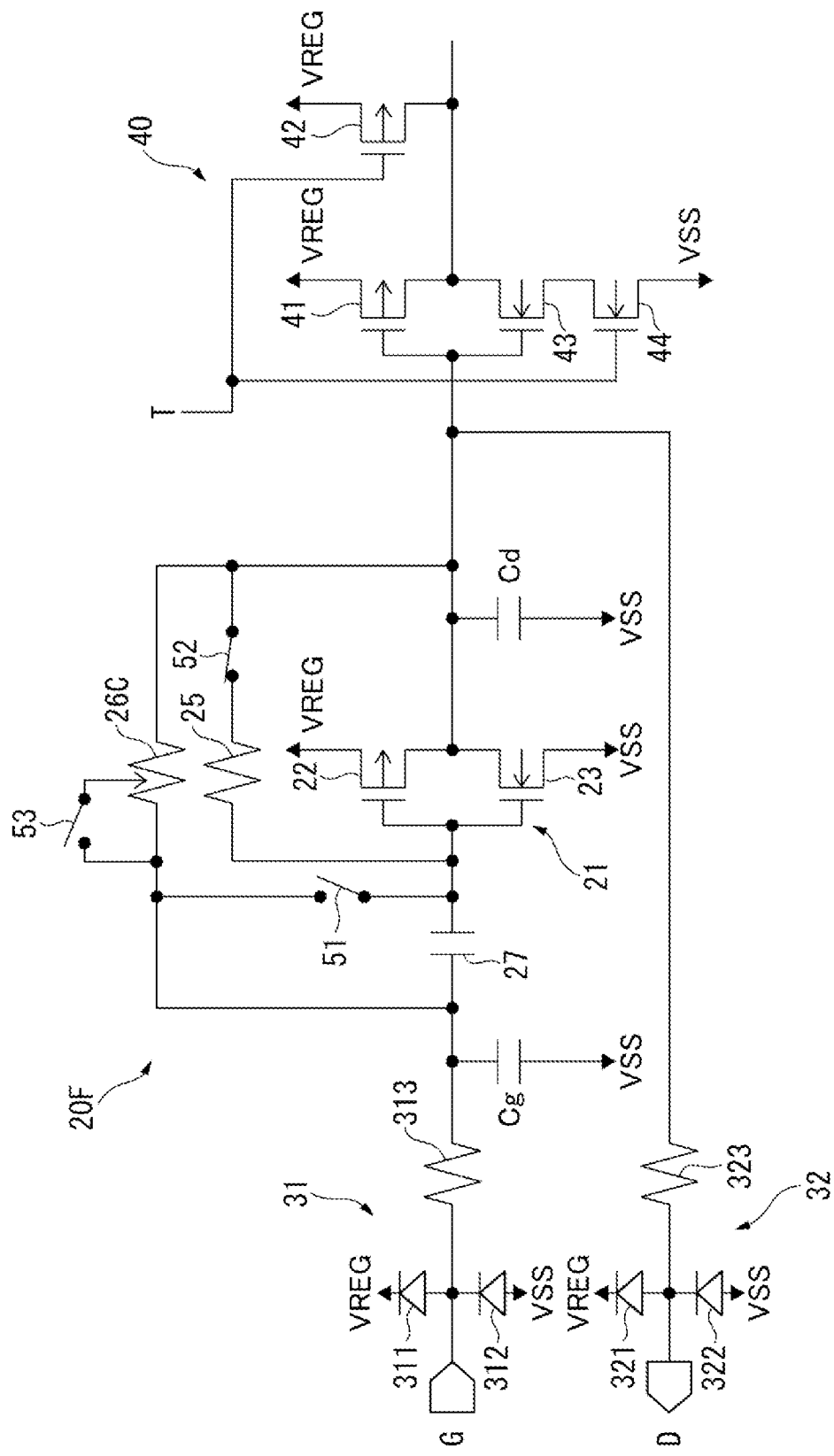
FIG. 17 is a circuit diagram illustrating the oscillating circuit at the time of stable oscillation according to the first modified example.

For example, in Third Embodiment, although the second switch 52 is disposed at the point between the DC cut capacitor 27 and the inverter 21 and the input side of the first feedback resistor 25, as an oscillating circuit 20F illustrated in FIGS. 16 and 17, the second switch 52 may be arranged on the output side of the first feedback resistor 25. That is, the second switch 52 configured to uncouple the first feedback resistor 25 at the start of oscillation may be coupled in series to the first feedback resistor 25. Thus, as illustrated in FIGS. 9 and 10, the second switch 52 may be coupled in series to the input side of the first feedback resistor 25, or the second switch 52 may be coupled in series to the output side of the first feedback resistor 25, as illustrated in FIGS. 16 and 17. That is, when the second switch 52 is short-circuited, the first feedback resistor 25 is coupled in parallel to the inverter 21, and when the second switch 52 is opened, the first feedback resistor 25 is uncoupled and does not function as a feedback resistor.

According to the oscillating circuit 20F of the first modified example, similar to the Third Embodiment, as illustrated in FIG. 16, at the start of the oscillation, the first feedback resistor 25 is uncoupled and the third switch 53 is also short-circuited to switch the second feedback resistor 26C to a small resistance value, which is R4. Therefore, it is possible to provide an oscillating circuit 20F suitable for the case where the activation characteristic can be improved when the feedback resistance value at the start of the oscillation is smaller than the feedback resistance value at the time of stable oscillation.

Note that, the order of short-circuiting and opening the third switch 53 may be reversely controlled with respect to the first modified example. That is, at the start of the oscillation of the oscillating circuit 20F, the first switch 51 may be short-circuited, the second switch 52 and the third switch 53 may be opened, and at the time of stable oscillation, the first switch 51 may be opened and the second switch 52 and the third switch 53 may be short-circuited.

In this case, similar to Fourth Embodiment, at the start of the oscillation, the second switch 52 is opened to uncouple the first feedback resistor 25, and the third switch 53 is opened to set the second feedback resistor 26C to a resistance value R3, which is higher than R4. Therefore, it is possible to provide an oscillating circuit suitable for the case where the activation characteristics can be improved by setting the feedback resistance value at the start of the oscillation to a resistance value R3 higher than R4.

Second Modified Example

Figure 18:
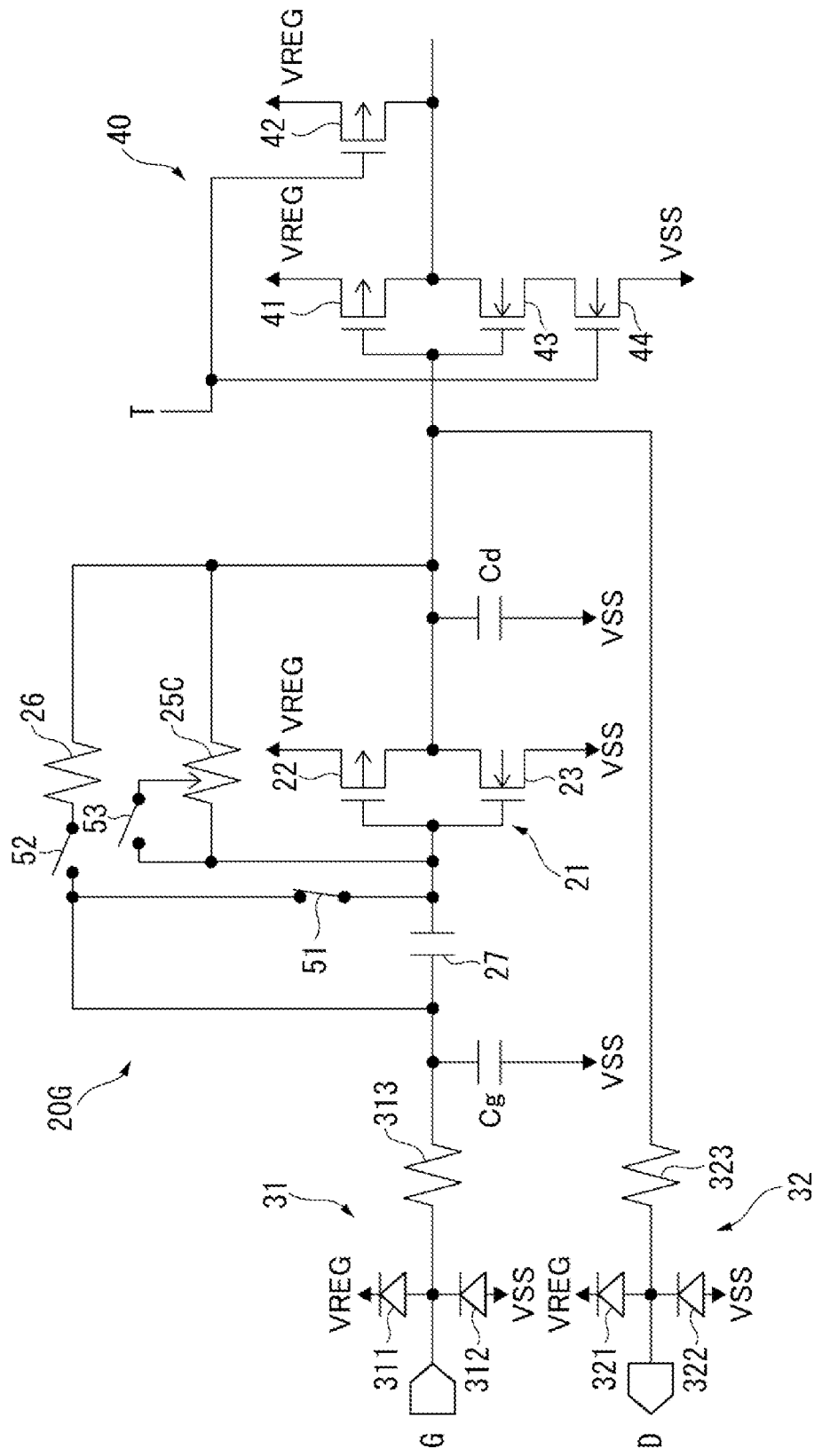
FIG. 18 is a circuit diagram illustrating an oscillating circuit at the start of the oscillation according to a second modified example.
Figure 19:
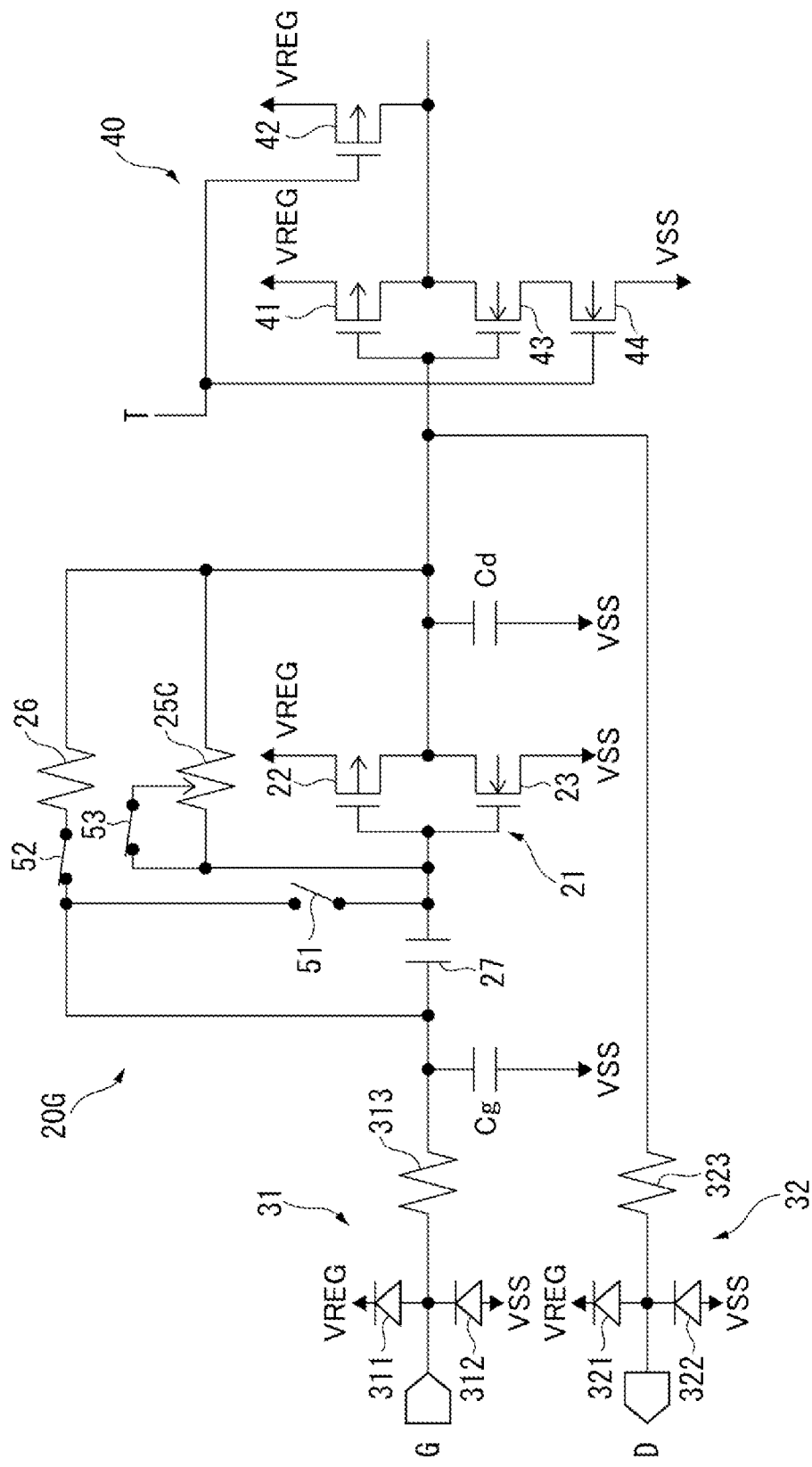
FIG. 19 is a circuit diagram illustrating the oscillating circuit at the time of stable oscillation according to the second modified example.

Further, as in an oscillating circuit 20G illustrated in FIGS. 18 and 19, a first feedback resistor 52C may be configured with a variable resistor, a second switch 52 may be coupled in series to a second feedback resistor 26, and a third switch 53 may be disposed to switch the variable resistance value of the first feedback resistor 25C. The resistance value of the first feedback resistor 25C when the third switch is opened is set to be R5, and the resistance value of the first feedback resistor 25C when the third switch 53 is short-circuited is set to be R6, it is set to exhibit a relationship R5>R6.

As illustrated in FIG. 18, when the oscillation of the oscillating circuit 20G starts, the control circuit 15 short-circuits the first switch 51 and opens the second switch 52 and the third switch 53. Further, as illustrated in FIG. 19, when the oscillation of the oscillating circuit 20D becomes stable, the control circuit 15 opens the first switch 51, and short-circuits the second switch 52 and the third switch 53.

According to the oscillating circuit 20G of the second modified example, as illustrated in FIG. 19, the first feedback resistor 25C can be adjusted as a variable resistance R6, thus can be set according to the capability of the inverter 21.

Third Modified Example

Figure 20:
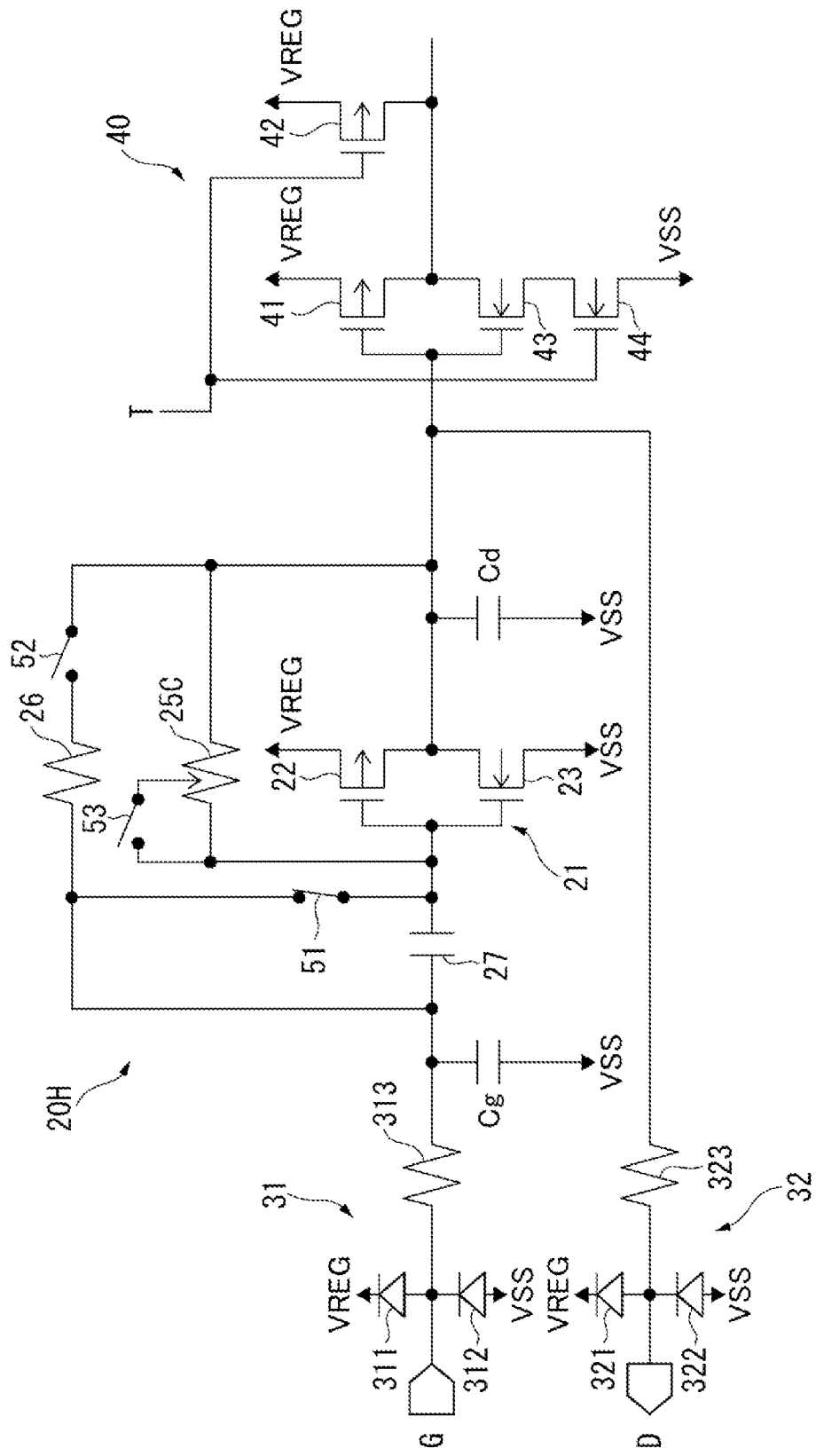
FIG. 20 is a circuit diagram illustrating an oscillating circuit at the start of the oscillation according to a third modified example.
Figure 21:
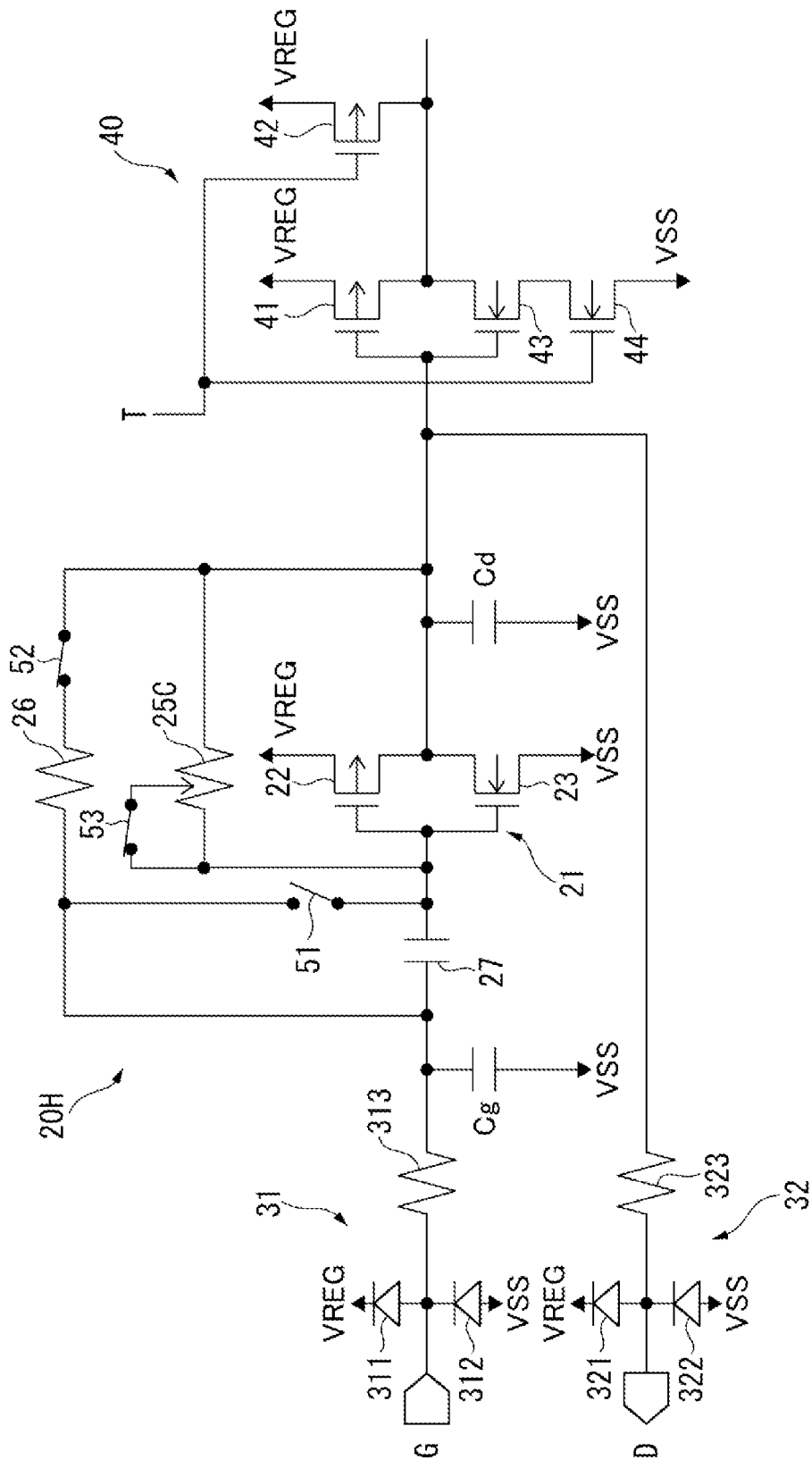
FIG. 21 is a circuit diagram illustrating the oscillating circuit at the time of stable oscillation according to the third modified example.

With respect to the second modified example, as illustrated in FIGS. 20 and 21, the position of the second switch 52 coupled in series to the second feedback resistor 26 may be coupled to the output terminal D of the second feedback resistor 26. In this third modified example, the same functions and effects as those of the second modified example can be obtained.

Furthermore, the order of short-circuiting and opening the third switch 53 may be reversely controlled with respect to the second modified example and the third modified example. That is, at the start of the oscillation of the oscillating circuits 20G and 20H, the first switch 51 and the third switch 53 may be short-circuited, the second switch 52 may be opened, and at the time of stable oscillation, the first switch 51 and the third switch 53 may be opened and the second switch 52 may be short-circuited.

The oscillating circuits 20, 20B, 20C, 20D, 20E, 20F, 20G and 20H of the respective embodiments described above are incorporated in the movement of the electronic watch 1, but can be widely used in various electronic devices and the like in which the oscillating circuit is incorporated. In particular, a semiconductor device 10 having the oscillating circuits 20, 20B, 20C, 20D, 20E, 20F, 20G, and 20H can be configured, and power consumption can be reduced, thus, the oscillating circuits are suitable for battery-driven compact electronic devices.

Furthermore, in the respective embodiments described above, the constant voltage circuit 14 is controlled by the control circuit 15, a high voltage VREG was applied at the start of the oscillation, and a low voltage VREG lower than the high voltage was applied at the time of stable oscillation, but the VREG level may not be switched between the start of oscillation and the time of stable oscillation. Specifically, for example, in First Embodiment, a predetermined VREG is applied in step S3 and the process of step S5 is not performed. In particular, in the present disclosure, the feedback resistance value of the inverter 21 is changed between the start of oscillation and the time of stable oscillation, thus, even when a voltage V of VREG at the start of oscillation is set to the same level as that at the time of stable oscillation, the oscillation can be performed normally.

The oscillating circuit is not limited to the circuit according to the embodiments described above, and may include a switch bypassing the DC cut capacitor 27 at the start of the oscillation. Furthermore, a switch that is capable of switching the feedback resistance value may be included at the start of the oscillation and the time of stable oscillation.

In the embodiments and the modified examples described above, the third switch 53 disposed on the feedback resistors 26C and 25C, which are variable resistors, is coupled to the input side of the feedback resistors 26C and 25C, but may be coupled to the output side of the feedback resistors 26C and 25C.

What is claimed is:

1. A semiconductor device comprising an oscillating circuit and a control circuit, wherein the oscillating circuit includes
    an input terminal and an output terminal, to both of which an oscillator is coupled,
    a DC cut capacitor having one terminal coupled to the input terminal,
    an inverter coupled between the other terminal of the DC cut capacitor and the output terminal,
    a first feedback resistor coupled in parallel to the inverter,
    a second feedback resistor coupled in parallel to the DC cut capacitor and the inverter, and
    a switch coupled in parallel to the DC cut capacitor, and
    at a start of oscillation of the oscillator, the control circuit is configured to short-circuit the switch, the second feedback resistor forms a signal path bypassing the DC cut capacitor and is coupled in parallel to the first feedback resistor, and a feedback resistance of the inverter is configured by the first feedback resistor and the second feedback resistor which are coupled in parallel, and
    after a predetermined time has elapsed from the start of the oscillation, the control circuit is configured to open the switch, and the second feedback resistor functions as a circuit that stabilizes a potential of the input terminal.

2. A semiconductor device comprising an oscillating circuit and a control circuit, wherein
    the oscillating circuit includes
    an input terminal and an output terminal, to both of which an oscillator is coupled,
    a DC cut capacitor having one terminal coupled to the input terminal,
    an inverter coupled between the other terminal of the DC cut capacitor and the output terminal,
    a first feedback resistor coupled in parallel to the inverter,
    a second feedback resistor coupled in parallel to the DC cut capacitor and the inverter,
    a first switch coupled in parallel to the DC cut capacitor,
    a second switch coupled between an input side of the first feedback resistor and an input side of the inverter,
    a third switch coupled between an output side of the inverter and a point between the second switch and the first feedback resistor, and
    a fourth switch coupled between the output side of the inverter and output sides of the first feedback resistor and the second feedback resistor, and
    the control circuit is configured to short-circuit the first switch and the third switch and open the second switch and the fourth switch at a start of oscillation of the oscillator, and open the first switch and the third switch and short-circuit the second switch and the fourth switch after a predetermined time elapsed from the start of the oscillation.

3. A semiconductor device comprising an oscillating circuit and a control circuit, wherein
    the oscillating circuit includes
    an input terminal and an output terminal, to both of which an oscillator is coupled,
    a DC cut capacitor having one terminal coupled to the input terminal,
    an inverter coupled between the other terminal of the DC cut capacitor and the output terminal,
    a first feedback resistor coupled in parallel to the inverter,
    a second feedback resistor coupled in parallel to the DC cut capacitor and the inverter,
    a first switch coupled in parallel to the DC cut capacitor,
    a second switch coupled between an input side of the second feedback resistor and an input side of the DC cut capacitor,
    a third switch coupled between an output side of the inverter and a point between the second switch and the second feedback resistor, and a fourth switch coupled between the output side of the inverter and output sides of the first feedback resistor and the second feedback resistor, and the control circuit is configured to short-circuit the first switch and the third switch and open the second switch and the fourth switch at a start of oscillation of the oscillator, and open the first switch and the third switch and short-circuit the second switch and the fourth switch after a predetermined time elapsed from the start of the oscillation.

4. A watch movement comprising the semiconductor device according to claim 1.

5. An electronic watch comprising the semiconductor device according to claim 1.

6. A watch movement comprising the semiconductor device according to claim 2.

7. An electronic watch comprising the semiconductor device according to claim 2.

8. A watch movement comprising the semiconductor device according to claim 3.

9. An electronic watch comprising the semiconductor device according to claim 3.

* * * * *